(12) United States Patent
Price et al.

(10) Patent No.: US 9,077,371 B2
(45) Date of Patent: Jul. 7, 2015

(54) METHODS AND APPARATUS FOR A SUCCESSIVE APPROXIMATION REGISTER ANALOG-TO-DIGITAL CONVERTER

(71) Applicant: QUALCOMM Incorporated, San Diego, CA (US)

(72) Inventors: Burt L. Price, Raleigh, NC (US); Dhaval R. Shah, Raleigh, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 13/778,204

(22) Filed: Feb. 27, 2013

(65) Prior Publication Data

US 2014/0118176 A1    May 1, 2014

Related U.S. Application Data

(60) Provisional application No. 61/720,415, filed on Oct. 31, 2012.

(51) Int. Cl.
*H03M 1/38* (2006.01)
*H03M 1/12* (2006.01)
*H03M 1/46* (2006.01)

(52) U.S. Cl.
CPC ........ *H03M 1/38* (2013.01); *H03M 1/12* (2013.01); *H03M 1/462* (2013.01)

(58) Field of Classification Search
CPC .......... H03M 1/12; H03M 1/38; H03M 1/462
USPC .......................................... 341/161, 162, 155
See application file for complete search history.

(56) References Cited

U.S. PATENT DOCUMENTS 4,314,235 A * 2/1982 Ruf et al. ................ 341/122
4,454,500 A * 6/1984 Kato et al. ............... 341/108

(Continued)

FOREIGN PATENT DOCUMENTS

EP    0766405 A1    4/1997
EP    0889598 A1    1/1999

OTHER PUBLICATIONS

Anderson T.O, "Optimum Control Logic for Successive Approximation Analog-to-Digital Converters", JPL Technical Report, Feb. 15, 1973, pp. 168-176, XP055100984, Retrieved from the Internet: URL:http://ipnpr.jpl.nasa.gov/progress_report2/XIII/XIIIW.PDF [retrieved on Feb. 7, 2014].
Dondi S., et al., "A 6-bit, 1.2 GHz Interleaved SAR ADC in 90nm CMOS", Research in Microelectronics and Electronics 2006, PH. D. Otranto, Italy Jun. 12-15, 2006, Piscataway, NJ, USA,IEEE, Jun. 12, 2006, pp. 301-304, XP010937691.

(Continued)

*Primary Examiner* — Brian Young
(74) *Attorney, Agent, or Firm* — Nicholas J. Pauley; Peter Michael Kamarchik; Paul Holdaway

(57) ABSTRACT

Methods and apparatus for a successive approximation register analog to digital converter are provided. In an example, provided is a method for digitally representing an analog input signal. A bit of the digital output signal is generated by altering a test voltage by an amount comparable to a weight afforded to the bit, comparing the altered test voltage with the analog input signal to create a comparison output, switching a two-to-one multiplexer to select the comparison output instead of a preceding shift-successive approximation register block output, storing the comparison output in a flip-flop, inhibiting clocking of the flip-flop, and outputting the comparison output from the flip-flop as the bit of the digital output signal.

34 Claims, 20 Drawing Sheets

(56) References Cited

U.S. PATENT DOCUMENTS

| | | | |
|---|---|---|---|
| 4,527,148 A * | 7/1985 | Kuboki et al. | 341/163 |
| 4,593,270 A | 6/1986 | White | |
| 4,852,130 A * | 7/1989 | Draxelmayr | 377/81 |
| 5,859,608 A * | 1/1999 | Fucili et al. | 341/165 |
| 6,154,163 A | 11/2000 | Rossi et al. | |
| 6,300,889 B1 | 10/2001 | Piasecki | |
| 7,664,219 B2 * | 2/2010 | Tso et al. | 377/73 |
| 8,169,517 B2 | 5/2012 | Poonnen et al. | |
| 8,271,931 B2 * | 9/2012 | Chen et al. | 716/133 |
| 8,633,846 B2 * | 1/2014 | Wu et al. | 341/163 |
| 8,659,462 B2 * | 2/2014 | Kang | 341/163 |
| 8,669,896 B2 * | 3/2014 | Tsai et al. | 341/161 |
| 2006/0248487 A1 | 11/2006 | Kapoor et al. | |
| 2012/0105265 A1 | 5/2012 | Agarwal et al. | |

OTHER PUBLICATIONS

International Search Report and Written Opinion—PCT/US2013/067221—ISA/EPO—Feb. 19, 2014.

Rossi A et al., "Nonredundant successive approximation register for A/D converters", Electronics Letters, IEE Stevenage, GB,vol. 32, No. 12, Jun. 6, 1996, pp. 1055-1057,XP006005274, ISSN: 0013-5194, DOI: 10.1049/EL:19961113.

Shaker M., et al., "A clock gated flip-flop for low power applications in 90 nm CMOS", Circuits and Systems (ISCAS), 2011 IEEE International Symposium on, IEEE, May 15, 2011, pp. 558-562, XP031997692, DOI: 10.1109/ISCAS.2011.5937626, ISBN: 978-1-4244-9473-6.

* cited by examiner

METHODS AND APPARATUS FOR A SUCCESSIVE APPROXIMATION REGISTER ANALOG-TO-DIGITAL CONVERTER

CLAIM OF PRIORITY UNDER 35 U.S.C. §119

The present Application for Patent claims priority to U.S. Provisional Patent Application No. 61/720,415 entitled "METHODS AND APPARATUS FOR A SUCCESSIVE APPROXIMATION ANALOG-TO-DIGITAL CONVERTER" filed Oct. 31, 2012, and assigned to the assignee hereof and hereby expressly incorporated by reference herein.

FIELD OF DISCLOSURE

This disclosure relates generally to electronics, and more specifically, but not exclusively, to methods and apparatus for a successive approximation register analog to digital converter.

BACKGROUND

There is unrelenting market demand for circuits that are smaller ze, use less power, are faster, and are easily scalable when compared to conventional devices. Few circuit elements, including analog to digital converters (ADCs), are left untouched by these ever-present market requirements.

An ADC is a circuit that samples an input analog signal (either voltage or current) and produces a digital signal (e.g., a binary signal) representing an amplitude of the input analog signal. One type of ADC is a successive approximation register (SAR) ADC.

Conventional SAR ADC technology has existed for some time. Generally, conventional SAR ADCs generate a digital code representing a magnitude of an input voltage. To produce the digital code, conventional SAR ADCs operate in two phases—a sampling phase and a bit trial phase. During the sampling phase, the input voltage is acquired in a circuit called a "sample-and-hold" that precedes the ADC. During the bit trial phase, the input voltage is compared against digitally-controlled test voltages to determine whether the input voltage is greater than, or less than, a particular test voltage. Typical SAR ADCs operate bit by bit, comparing the input voltage initially to a first test voltage that is an analog voltage value corresponding to a most significant bit (MSB) of the digital code, deciding a value of the MSB, and thereafter comparing the input voltage to a subsequent test voltage that is an analog voltage value representing a combination of the selected MSB value and a. candidate value for the next lower bit position. In conventional SAR ADCs, this process uses either a complicated state machine control circuit or a shift-register based control circuit and a register of flip-flops known as a Successive Approximation Register or SAR, The shift register indicates which bit is selected during the bit trial phase and the SAR register stores the results of the bit trial phase. The bit trial process operates incrementally across all bit positions from the MSB to a least significant bit (LSB) position of the digital code, at which time the digital code corresponds to the input voltage. The digital code is then output from the SAR. ADC. While conventional SAR ADCs are functional, as mentioned above, there is market pressure to shrink and simplify SAR ADC circuitry, reduce SAR. ADC power consumption, speed SAR ADC conversion time, and make SAR ADC circuitry scalable.

Accordingly, there are long-felt industry needs for methods and apparatus that improve upon conventional methods and apparatus, including methods and apparatus for a SAR ADC that is improved over conventional methods and apparatus.

SUMMARY

This summary provides a basic understanding of some aspects of the present teachings. This summary is not exhaustive in detail, and is neither intended to identify all critical features, nor intended to limit the scope of the claims.

Exemplary methods and apparatus for a successive approximation register analog to digital converter are provided. In an exemplary method for digitally representing an analog input signal, the analog input signal is received and a bit of the digital output signal is generated by altering a test voltage by an amount comparable to a weight afforded to the bit. The altered test voltage is compared with the analog input signal to create a comparison output and a two-to-one multiplexer is switched to select the comparison output instead of a preceding shift-successive approximation register block output. The comparison output is stored in a flip-flop and clocking of the flip-flop is inhibited. The comparison output is output from the flip-flop as the bit of the digital output signal.

In a further example, provided is a non-transitory computer-readable medium, comprising instructions stored thereon that, if executed by a processor, cause the processor to execute at least a part of the aforementioned method. The non-transitory computer-readable medium can be integrated with a device, such as a mobile device, a music player, a video player, an entertainment unit, a navigation device, a communications device, a personal digital assistant (PDA), a fixed location data unit, and/or a computer.

In another example, provided is an apparatus configured to digitally represent an analog input signal. The apparatus includes means for receiving the analog input signal and means for generating a bit of the digital output signal by altering a test voltage by an amount comparable to a weight afforded to the bit; comparing the altered test voltage with the analog input signal to create a comparison output; switching a two-to-one multiplexer to select the comparison output instead of a preceding shift-successive approximation register block output; storing the comparison output in a flip-flop; inhibiting clocking of the flip-flop; and outputting the comparison output from the flip-flop as the bit of the digital output signal. The apparatus can include at least a part of the means for generating the bit of the digital output signal integrated on a semiconductor die. The apparatus can also include at least one of a processor, integrated circuit, base station, and a mobile device, with which the means for generating the bit of the digital output signal is integrated.

At least a part of the apparatus can be integrated in a semiconductor die. Further, at least a part of the apparatus can be integrated with a device, such as a mobile device, a set top box, a music player, a video player, an entertainment unit, a navigation device, a communications device, a personal digital assistant (PDA), a fixed location data unit, and/or a computer. In a further example, provided is a non-transitory computer-readable medium, comprising instructions stored thereon that, if executed by a lithographic device, cause the lithographic device to fabricate at least a part of the apparatus.

In another example, provided is a successive approximation register (SAR) including a flip-flop configured to perform functions of a shift register and a flip-flop. At least a part of the SAR can be integrated on a semiconductor die. The SAR can include at least one of a processor, integrated circuit, base station, and a mobile device, with which the flip-flop is integrated. The SAR can include a NAND latch configured to inhibit clocking of the flip-flop. The SAR can include a NOR latch configured to inhibit clocking of the flip-flop. The SAR can also include an RC delay to mitigate and/or avoid a runaway condition and a two-input OR gate configured to inhibit clocking of the flip-flop. The RC delay can alternatively be implemented using other delay-inducing elements, such as a chain of buffers. The SAR can further include a serial and/or parallel read out circuit configured to read a state of the flip-flop.

In a further example, provided is an analog to digital converter (ADC), including a successive approximation register (SAR) including a flip-flop configured to perform functions of a shift register and a flip-flop. At least a part of the ADC is integrated on a semiconductor die. At least one of a processor, integrated circuit, base station, and a mobile device, can be integrated with the flip-flop. The ADC can include a NAND latch configured to inhibit clocking of the flip-flop. The ADC can include a NOR latch configured to inhibit clocking of the flip-flop. The ADC can further include an RC (resistor-capacitor) delay and a two-input OR gate configured to inhibit clocking of the flip-flop. The ADC can further include a serial read out circuit configured to read a state of the flip-flop. The ADC can also include a parallel read out circuit configured to read a state of the flip-flop. In a further example, the ADC does not include a shift register.

At least a part of the apparatus can be integrated on a semiconductor die. Further, at least a part of the apparatus can he integrated with a device, such as a mobile device, a set top box, a music player, a video player, an entertainment unit, a navigation device, a communications device, a personal digital assistant (PDA), a fixed location data unit, and/or a computer. In a further example, provided is a non-transitory computer-readable medium, comprising instructions stored thereon that, if executed by a lithographic device, cause the lithographic device to fabricate at least a part of the apparatus.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims, The novel features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

Figure 1:
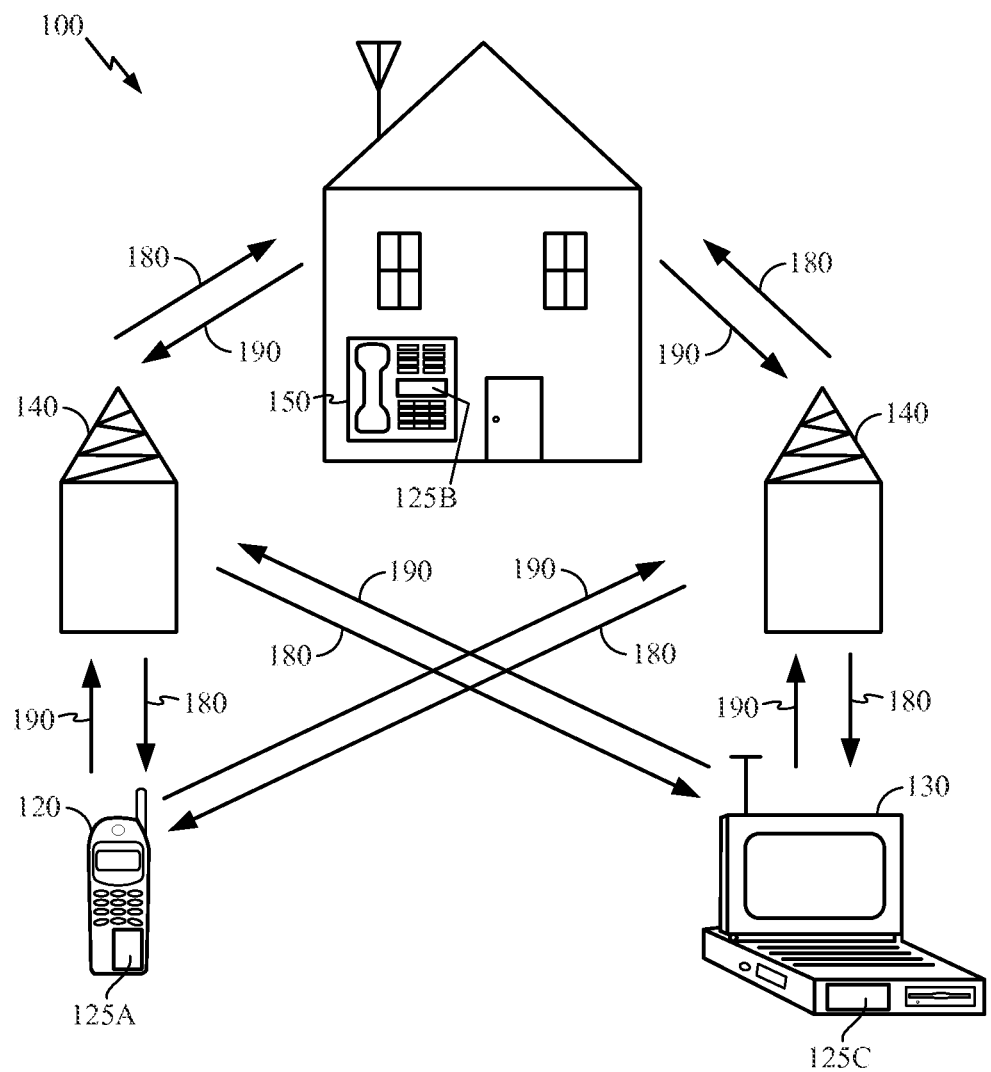
FIG. 1 depicts an exemplary communication system in which an embodiment of the disclosure may be advantageously employed.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus for successive approximation register (SAR) analog to digital converters (ADCs) are provided. SAR ADCs implement a binary search using hardware, operating on one bit at a time. Unlike conventional devices, the exemplary apparatuses disclosed herein do not use a shift register that is separate from a respective flip-flop. Instead, the functions conventionally performed by the shift register are instead performed by a flip-flop. The disclosed improved SAR ADCs can be used in any place a conventional ADC is implemented, such as in on-die current measuring and reporting, integrated circuit self-testing, with dual-rank resistor string DACs, and systems-on-a-chip (SOC).

The examples advantageously address the long-felt industry needs, as well as other previously unidentified needs, and mitigate shortcomings of the conventional methods and apparatus. For example, an advantage provided by the exemplary apparatuses and methods disclosed herein is a reduction in size and power consumption, relative to conventional devices. Another advantage is that the exemplary apparatuses are scalable to provide ADCs having different bit widths. A further advantage is that the exemplary apparatuses disclosed herein use a minimum quantity of circuitry, thus providing a SAR ADC that uses minimal area on an integrated circuit die, while retaining ease of scalability.

Examples of the current teachings are disclosed in this application's text and drawings, Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

In this description, certain terminology is used to describe certain features. The term "mobile device" can describe, and is not limited to, a mobile phone, a mobile communication device, a remote unit, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Description of the Figures

FIG. 1 depicts an exemplary wireless communication system 100 in which an embodiment of the disclosure may be advantageously employed. For purposes of illustration, FIG. 1 shows three remote units 120, 130, and 150, as well as two base stations 140. The wireless communication system 100 can have many more remote units and/or more base stations. The remote units 120, 130, and 150 include at least a part of an embodiment 125A-C of the disclosure as discussed further herein. FIG. 1 also shows forward link signals 180 from the base stations 140 and the remote units 120, 130, and 150, as well as reverse link signals 190 from the remote units 120, 130, and 150 to the base stations 140.

In FIG. 1, the remote unit 120 is shown as a mobile telephone, the remote unit 130 is shown as a portable computer, and the remote unit 150 is shown as a fixed location remote unit in a wireless local loop system. In examples, the remote unit 130 can be a mobile device, a hand-held personal communication systems (PCS) unit, a portable data unit such as a personal data assistant, a GPS-enabled device, a navigation device, a settop box, a music player, a mobile device, a video player, an entertainment unit, any other device that stores and/or retrieves data. or computer instructions, and/or any combination thereof. Although FIG. 1 illustrates remote units according to the teachings of the disclosure, the disclosure is not limited to these exemplary illustrated units. Embodiments of the disclosure may be suitably employed in any device that experiences the problems of the conventional techniques and/ or can benefit from the advantages of the disclosed methods and devices.

Figure 2A:
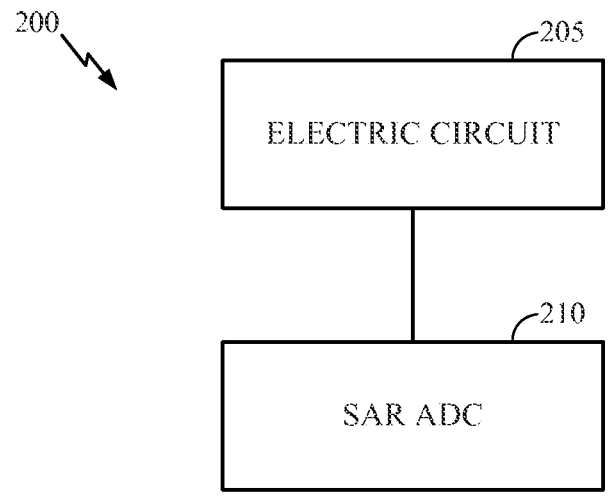
FIG. 2A depicts an exemplary circuit coupled to, and/or integrated with, an exemplary successive approximation register (SAR) analog to digital converter (ADC).

FIG. 2A depicts an exemplary circuit 200 having an electric circuit 205 coupled to and/or integrated with an exemplary SAR ADC 210 described hereby. The exemplary electric circuit 205 can be a mobile device; an analog sensor; an analog front-end; an analog port; a medical device; the remote unit 120, 130, 150; the base station 140, an integrated circuit, and/or any device in which uses an ADC.

In an example, the SAR ADC 210 implements a binary search algorithm in hardware. Many of the examples described herein have Successive Approximation Registers that start with an initial value of all zeros. In an alternative, the Successive Approximation Registers start with an initial value of all ones. As a further alternative, within the Successive Approximation Registers, the register representing the most significant bit is initially set to one, while the remaining registers are initially set o zero. The SAR ADC 210 can be implemented in these manners.

Figure 2B:
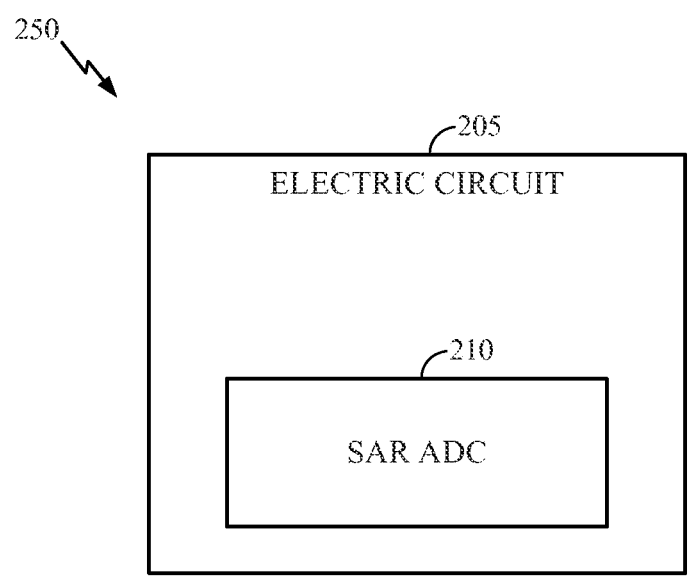
FIG. 2B depicts an exemplary SAR ADC that is an integral part of an exemplary circuit and/or electrical device.

FIG. 2B depicts an exemplary circuit 250 including the SAR ADC 210 described hereby as an integral part of the exemplary circuit 200.

Figure 3A:
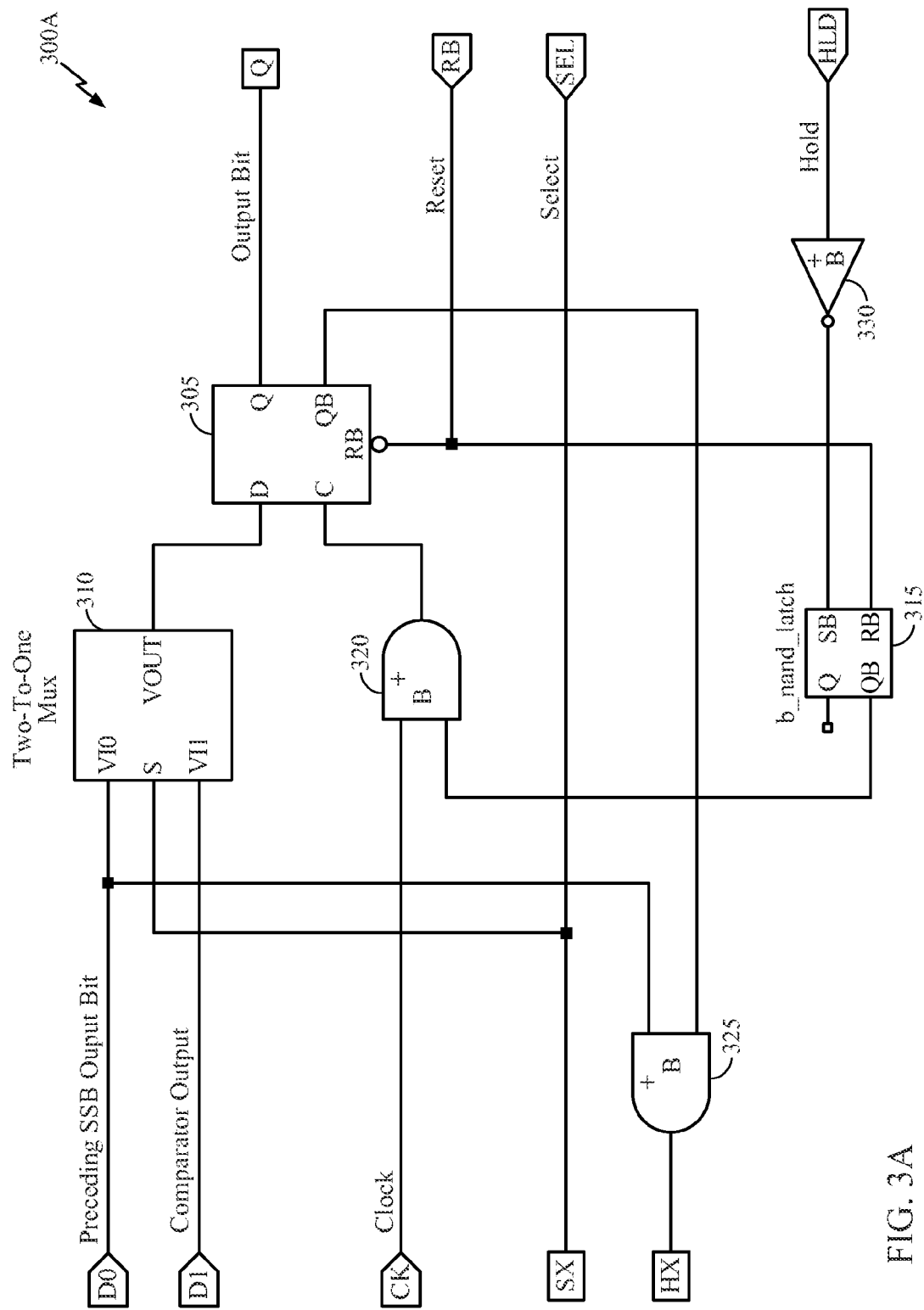
FIGS. 3A-3C depict exemplary shift-SAR blocks (SSBs).
Figure 3B:
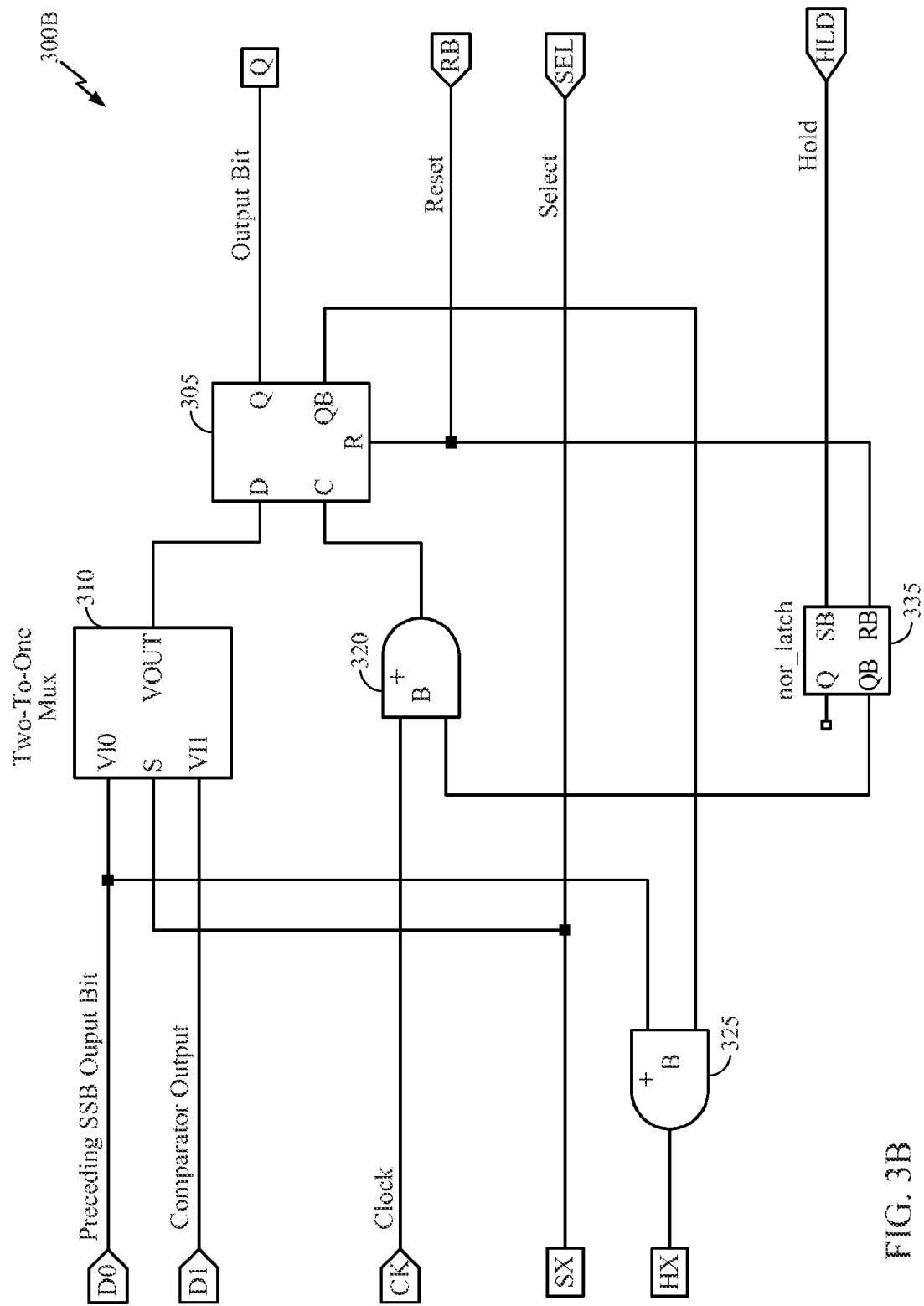

FIGS. 3A-3B depict exemplary respective shift-SAR blocks (SSBs) 300A-C. The SSBs 300A-C accomplish the same primary functions using different arrangements of hardware. Thus, when a single SSB is implemented in a one-bit ADC, the SSBs 300A-C are interchangeable. Further, when multiple SSBs are implemented in a SAR ADC, the SSBs 300A-C are interchangeable in groups of like SSBs. For example, a plurality of the SSB 300B can be used wherever a plurality of the SSB 300A can be used. Similarly, a plurality of the SSB 300C can be used wherever a. plurality of the SSB 300B can be used, and a. plurality of the SSB 300C can be used wherever a plurality of the SSB 300A can be used. This interchangeability applies to using the SSB 300A-C in the SAR ADCs described herein. Implementing the SSB 300A-C provides the advantages described herein.

Referring to FRI. 3A, the SSB 300A includes a masterslave flip-flop 305 with direct Reset-Bar, a two-to-one multiplexer 310, a NAND latch 315, a first AND gate 320, a second AND gate 325, and an inverter 330, During a sampling cycle, the multiplexer 310 outputs either (1) an output of a flip-flop of a preceding SSB that is input at multiplexer input VI0, or (2) a comparator output that is input at multiplexer input VI1, to produce a digital high or low result at VOUT. At the multiplexer 310 for the most significant bit, a voltage source is a substitute input at the VI0 input. The flip-flop 305 stores and outputs the output of the multiplexer 310, which forms an output bit (Q) of the SSB 300A. The output bit (Q) is a SAR ADC output bit and can be used to select a new test voltage subsequently compared by the comparator to the input analog voltage for a next less significant bit. A select signal can be input to the multiplexer 310 to cause the multiplexer 310 to switch from outputting the output of the preceding SSB's output (multiplexer input VI0) to outputting the comparator output (multiplexer input VI1).

The NAND latch 315 inhibits further clocking of the flip-flop 305 via the AND gate 320, so that the flip-flop 305 stores and outputs a result from the comparator for the result's associated sampling cycle, After the flip-flop 305 has produced the flip-flop 305's final digital output bit, the NAND latch 315 is set by the hold input (HLD). The hold input (HLD) can be received from a select output (SX) of another SSB that is configured to process a next less significant bit.

The second AND gate 325 provides a hold output (FIX) that can be coupled to a select input of another SSB that is configured to process a next more significant bit. The hold output (HX) can inhibit further clocking of a respective flip-flop in the SSB that is configured to process a next more significant bit, so that the respective flip-flop stores and outputs its result.

Referring to FIG. 3B. the SSB 300B includes the master-slave flip-flop 305 with direct Reset-Bar, the two-to-one multiplexer 310, a NOR latch 335, the first AND gate 320, and the second AND gate 325. The flip-flop 305, the multiplexer 310, the first AND gate 320, and the second AND gate 325 function in the manner described herein for the SSB 300A.

In the SSB 300B, the NOR latch 335 inhibits further clocking of the flip-flop 305 via the AND gate 320, so that the flip-flop 305 stores and outputs a result from the comparator for the result's associated sampling cycle. After the flip-flop 305 has produced the flip-flop 305's final digital output bit, the NOR latch 335 is set by the hold input (HLD). The hold input (HLD) can be received from a select output (SX) of another SSB that is configured to process a next less significant bit.

Figure 3C:
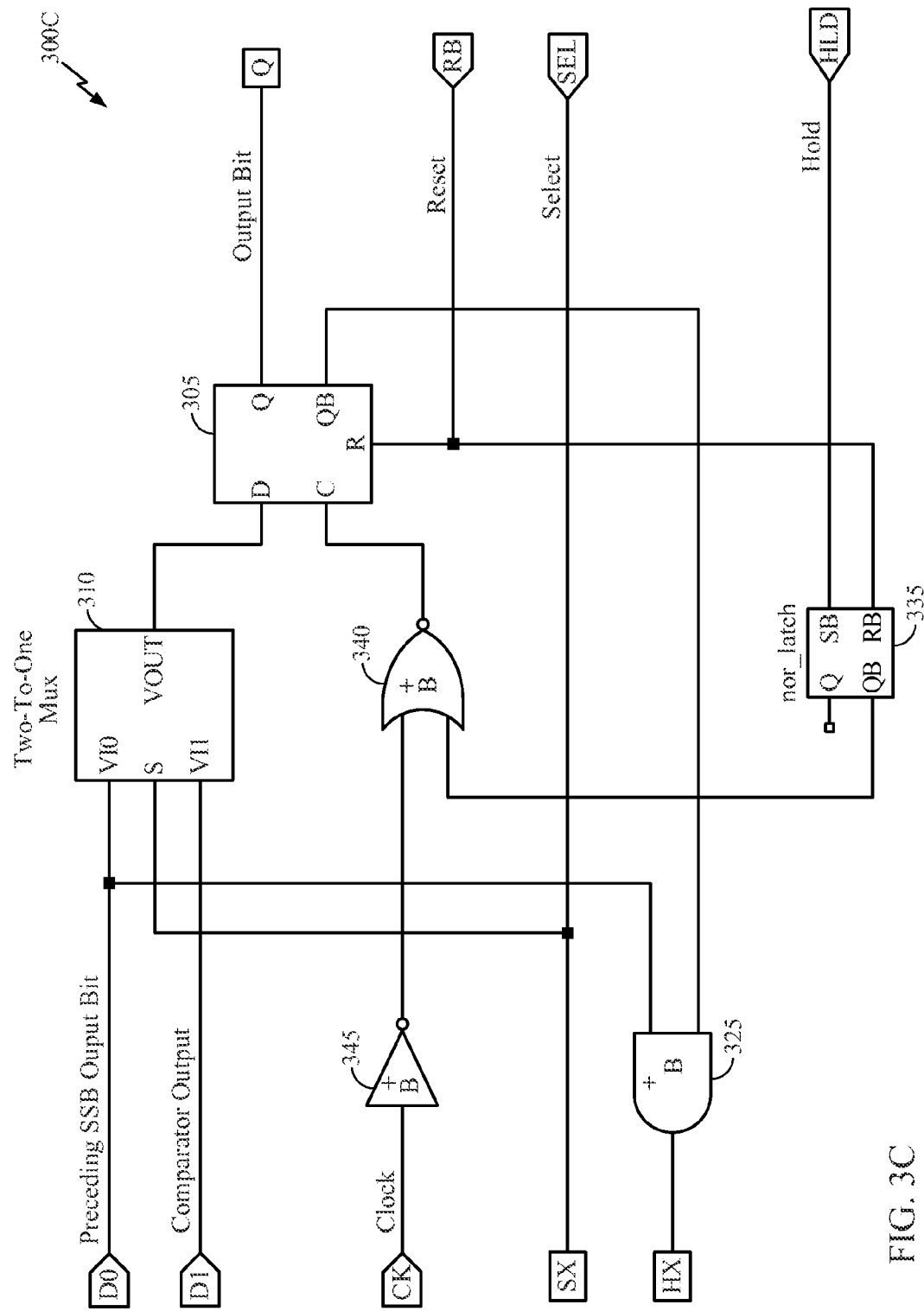

Referring to FIG. 3C, the SSB 300C includes the master-slave flip-flop 305 with direct Reset-Bar, the two-to-one multiplexer 310, a NOR latch 335, the second AND gate 325, a NOR gate 340, and an inverter 345. The flip-flop 305, the multiplexer 310, and the second AND gate 325 function in the manner described herein for the SSB 300A.

In the SSB 300C, the NOR latch 335 inhibits further clocking of the flip-flop 305 via the NOR gate 340, so that the flip-flop 305 stores and outputs a result from the comparator for the result's associated sampling cycle After the flip-flop 305 has produced the flip-flop 305's final digital output bit, the NOR latch 335 is set by the hold input (HLD). The hold input (HUD) can be received from a select output (SX) of another SSB that is configured to process a next less significant bit. The NOR gate 340 is actuated by the NOR latch 335 to control passing of the clock signal (CK) from the output of the inverter 345 to the flip-flop 305.

Figure 4:
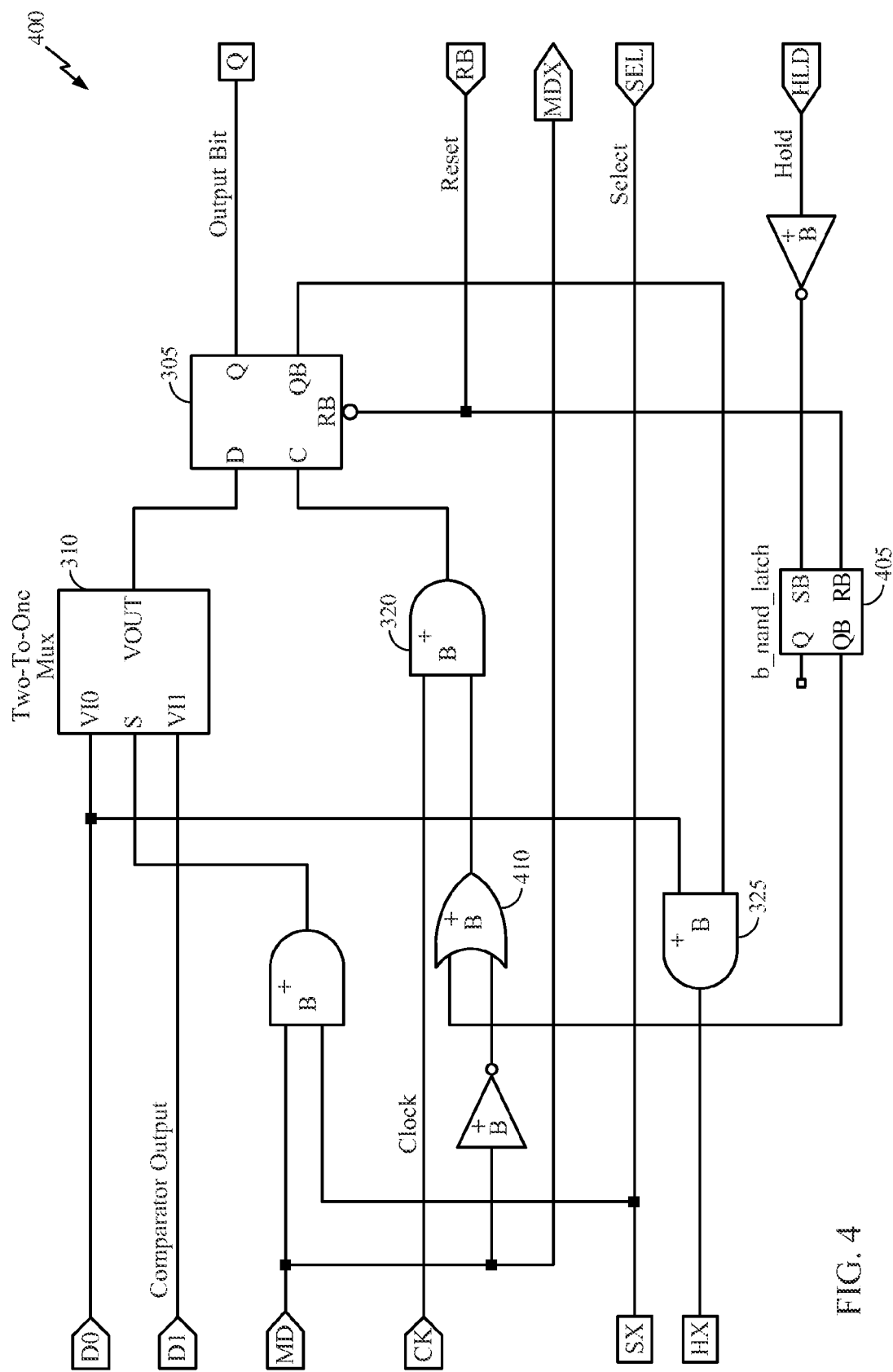
FIG. 4 depicts another exemplary SSB.

FIG. 4 depicts an exemplary shift-SAR block (SSB) 400 that is a modified version of the SSB 300A of FIG. 3A. While the comparison function of the SSB 400 is similar to that of the SSB 300A, the SSB 400's final digital output can be read out serially via the output bit (Q) of the last stage, rather than via a parallel output as in the SSB 300A of FIG. 3A. When line MD is set to one, the SSB 400 provides a parallel output. When line MD is set to zero, then the SSB 400 provides a serial output. Line MDX couples to line MD of a succeeding stage.

The SSB 400 also has a clock inhibit function that is different from that of the SSB 300A. The SSB 400 has a NAND latch 405 with an RC delay and a 2-input OR gate 410. Through the OR gate 410, the NAND latch 405 inhibits clocking to the flip-flop 305, when the flip-flop 305 has produced the flip-flop's 305 final digital output bit. When the NAND latch 315 output Q is set high, the NAND latch 315 output Qb is low, and the OR gate 410's output depends on line MD. When line MD is set to one, the OR gate 410 outputs a zero, which inhibits the clocking of the flip-flop 305, thus the output bit (Q) of flip-flop 305 does not change. When line MD is set to zero, the OR gate 410 outputs a one, which permits the clocking of the flip-flop 305, thus the output bit (Q) of flip-flop 305 can change. Line MD also affects switching of the multiplexer 310. When line MD is set to zero, the multiplexer 310 outputs the comparator output (multiplexer input VI1).

FIGS. 5A-F depicts an exemplary SSB-based 8-bit SAR. ADC 500 that uses the SSB 300A. Note that the arrows on the left and right sides of FIGS. 5A-F do not necessarily depict a direction of signal flow, but instead merely indicate that there is a. continuation of a conductor on an adjacent Figure.

Figure 5A:
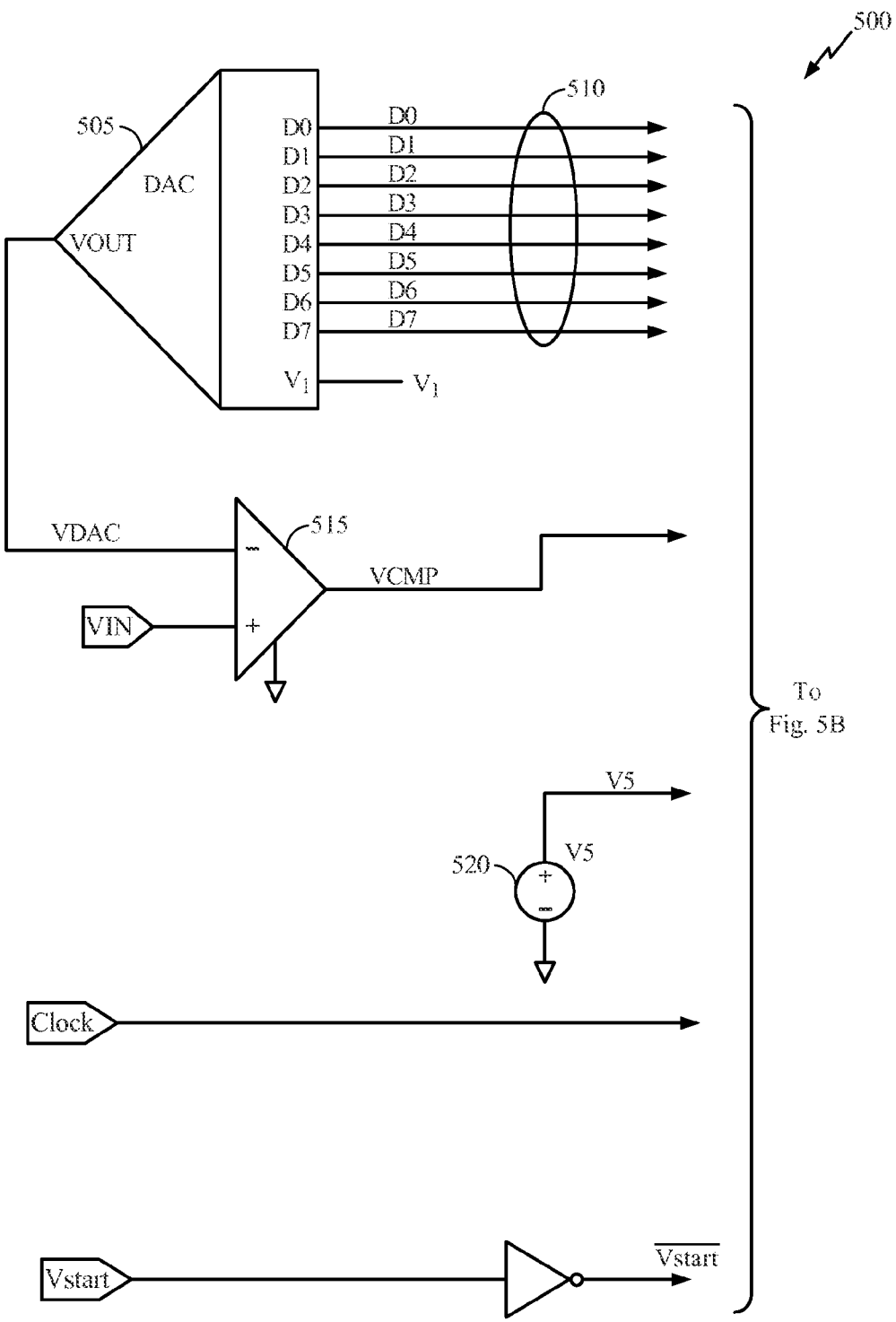
FIGS. 5A-F depicts an exemplary SSB-based 8-bit SAR ADC.
Figure 5B:
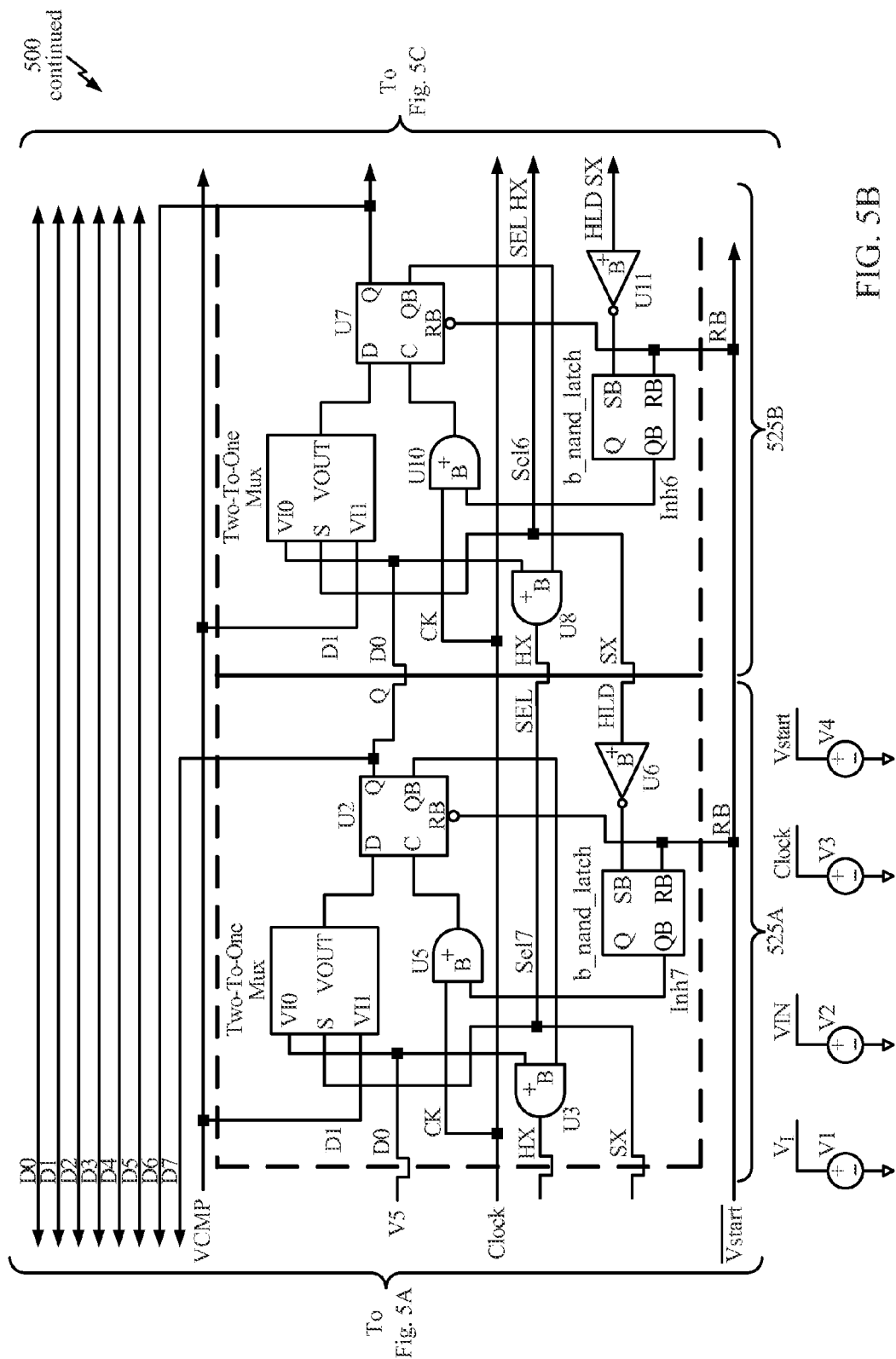
Figure 5C:
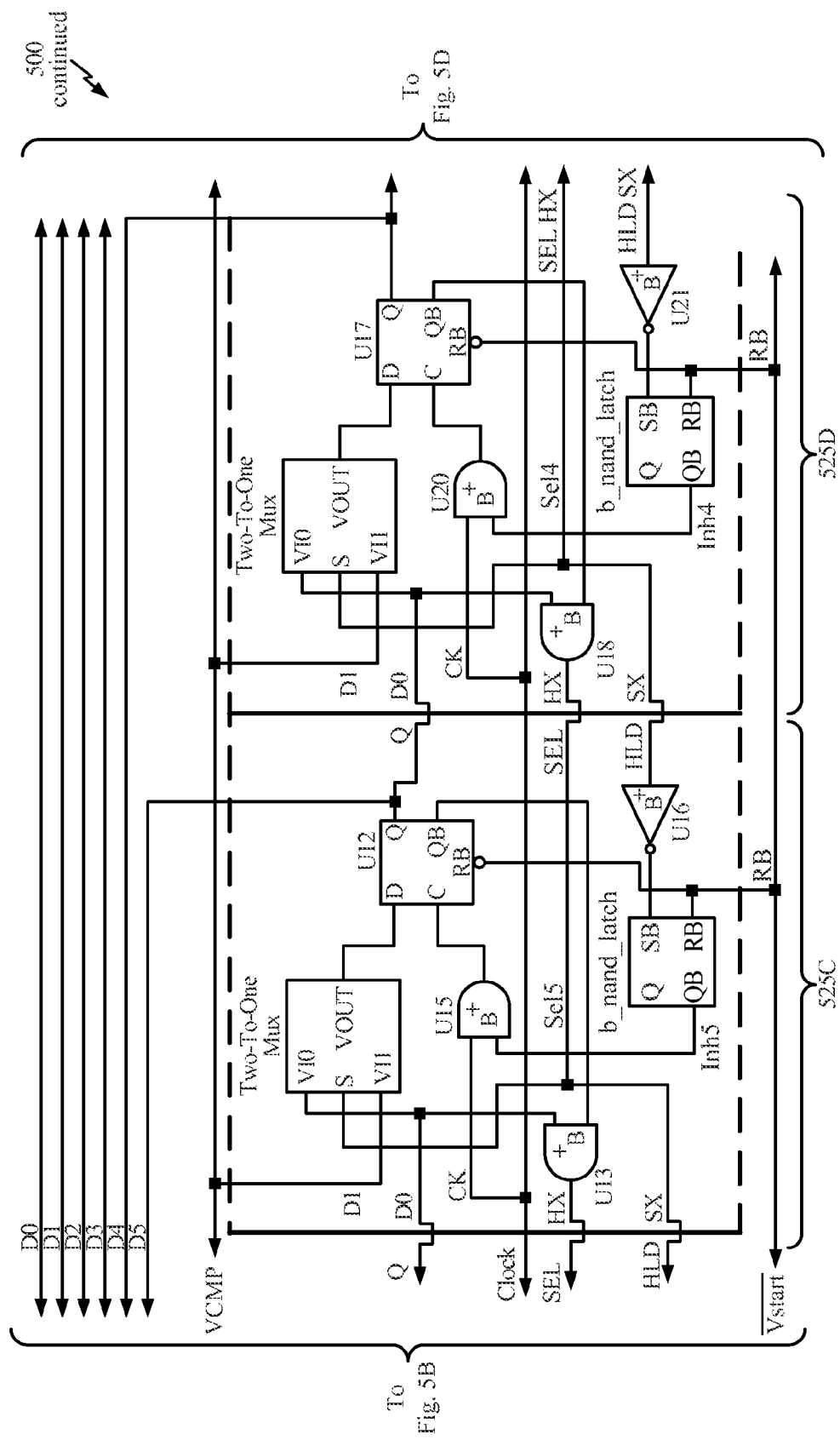
Figure 5D:
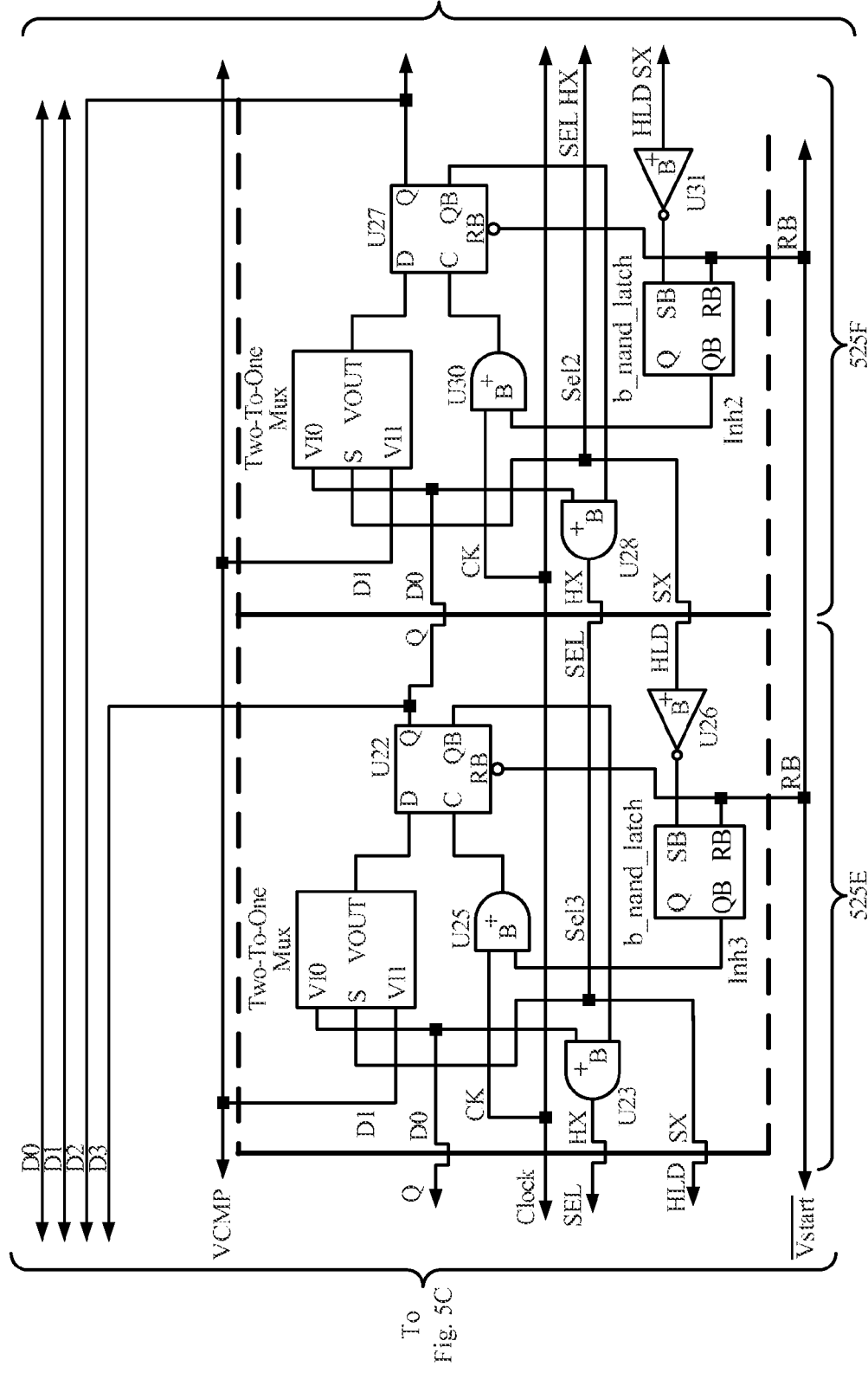
Figure 5E:
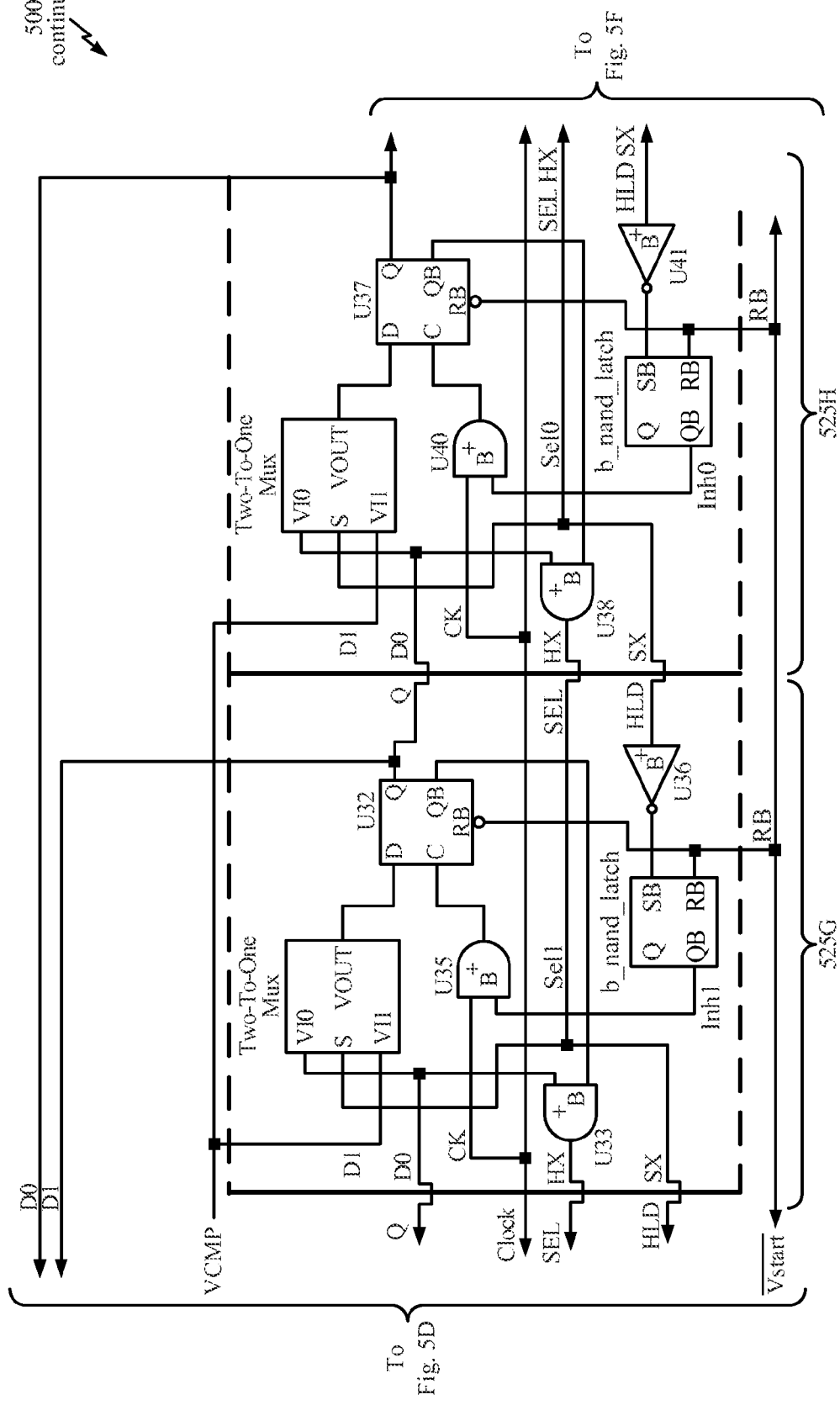
Figure 5F:
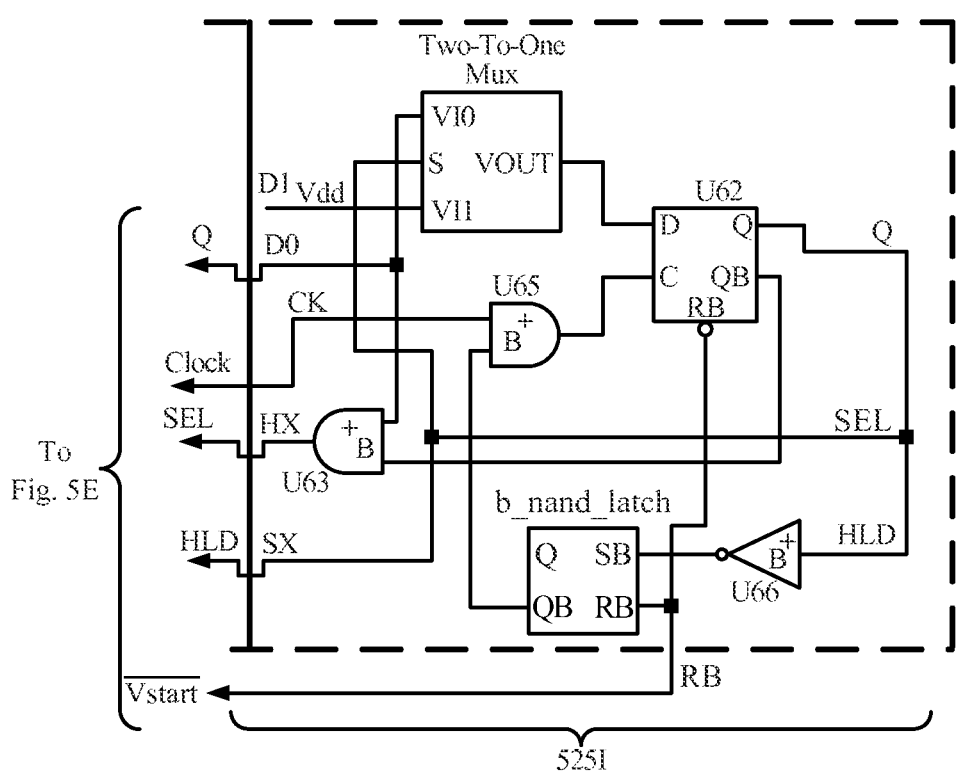

Referring to FIG. 5A, the SAR ADC 500 includes a digital to analog converter (DAC) 505 that converts an N-bit digital signal 510 (in the case of the SAR ADC 500, N=8 bits) to an analog test voltage (VDAC). The N-bit digital signal 510 is also the digital output of the SAR ADC 500. The analog test voltage (VDAC) is input to a comparator 515 that compares the analog test voltage (VDAC) to an input analog voltage (VIN) to produce a comparator output (VCMP). The input analog voltage (VIN) is the analog input to the SAR ADC 500. Further, the SAR ADC 500 includes a voltage source 520 that is coupled to one input of the multiplexer (VI0) in the SSB for the most significant bit. The voltage source 520 provides an initial high/low signal (V5) to the SSB for the most significant bit.

Referring to FIGS. 5B-F, there are nine iterations of the SSB 300A that are in series and are designated as the first through ninth SSB 525A-I, Of the nine iterations, the first SSB 525A is configured to determine the most significant bit (MSB) (e.g., D7) of the N-bit digital signal 510 and the eighth SSB 525H is configured to determine the least significant bit (e.g., D0) of the N-bit digital signal 510. The ninth SSB 525I does not produce a portion of the N-bit digital signal 510, but is necessary for proper circuit operation, as discussed elsewhere herein.

In FIGS. 5A-F, outputs of AND gates U8, U13, U18, U23, U28, U33, U38, and U63 are labeled, respectively, as select lines Se17, Se16, Se15, Se14, Se13, Se12, Se11, and Se10. Also, QB outputs of NAND latches in the first through ninth SSB 525A-I produce inhibit lines Inh7, Inh6, Inh5, Inh4, Inh3, Inh2, Inh1, and Inh0 (Inh stands for Inhibit, as in "inhibit further clocking").

Figure 6:
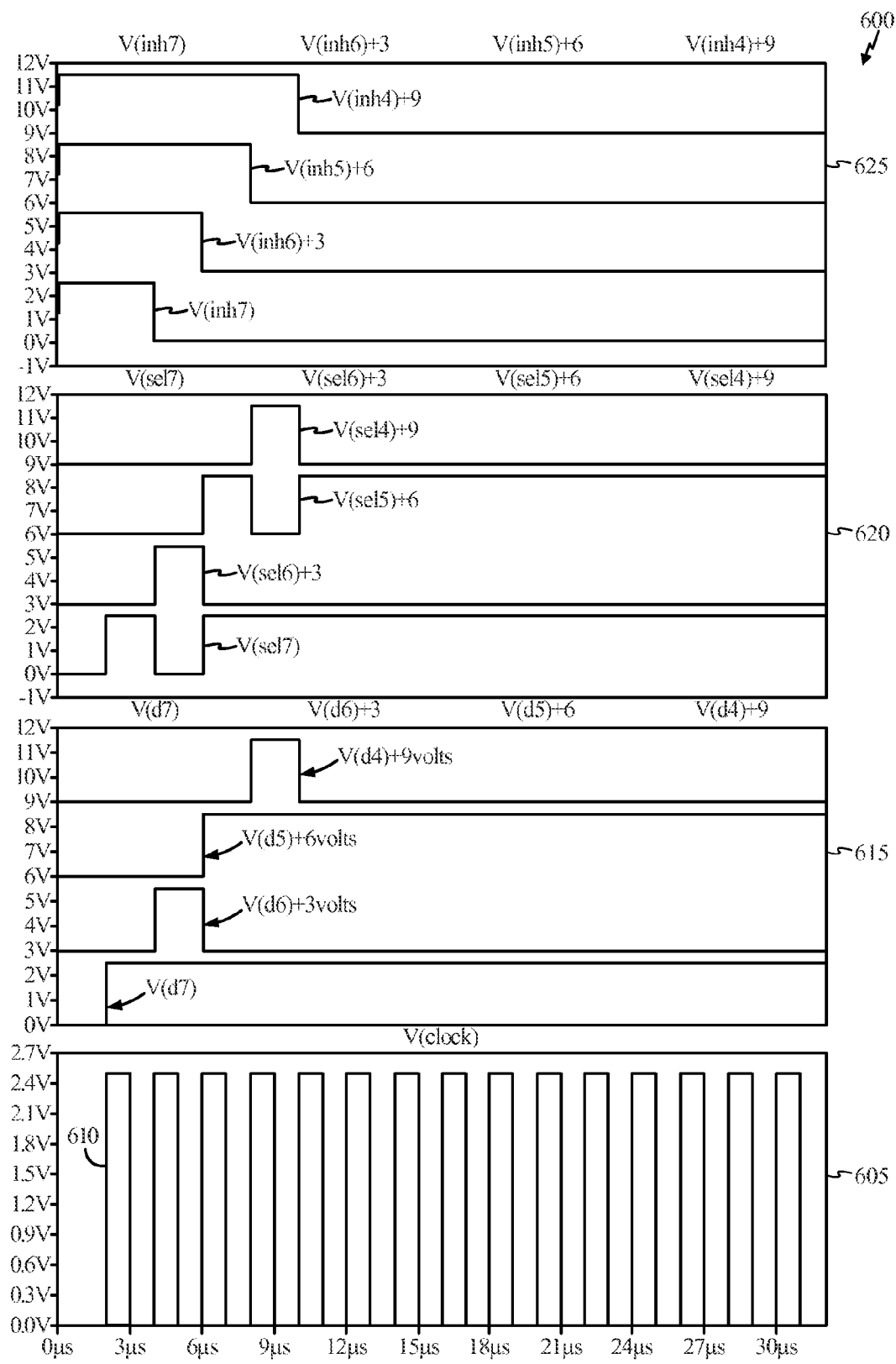
FIG. 6 depicts exemplary waveforms from simulated use of the SAR ADC in FIGS. 5A-F.

FIG. 6 depicts exemplary waveforms 600 from a simulated use of the SAR ADC 500. Referring to FIG. 6, in each pane, the waveforms 600 are offset from each other by multiples of 3VDC to better present these waveforms in FIG. 6, and the labels above each pane show these offset voltages. The offsets are not a required part of circuit configuration and/or operation. The bottom pane 605 depicts a clock waveform 610. The next higher pane 615 depicts transitions of the four most significant bits (D7-D4) of the N-bit digital signal 510. The next higher pane 620 shows the corresponding values of select lines Se17, Se16, Se15, and Se14, and the top pane 625 depicts corresponding values of inhibit lines Inh7, Inh6, Inh5, and Inh4. The exemplary waveforms 600 are depicted on the same timeline. The voltages depicted in FIG. 6 are examples selected merely to depict exemplary operation. Alternatively, other voltages can be used.

Exemplary operation of the SAR ADC 500 is as follows: Bits D7-D0 of the N-bit digital signal 510 are initially set to zero, and the voltage source 520 outputs a logic high signal (V5) to the first SSB 525A as an initial trial value. In an alternative example, the bits D7-D0 of the N-bit digital signal 510 are initially set to one, and the voltage source 520 outputs a logic low signal (V5) to the first SSB 525A as the initial trial value.

The analog voltage (VIN) is input to the SAR ADC 500. After the first rising edge of the clock, bit D7 is set to a logic high. The result of comparing the test voltage (VDAC) with the input voltage (VIN) is such that bit D7 is kept high, as bit D7 stays high at the second rising edge of the clock (for this particular exemplary input voltage (VIN)). As bit D7 goes high, and with bit D6 still low, AND gate U8 makes Se17 go high. The select line Se17 going high causes the mux in front of flip-flop U2 to switch from outputting the initial high/low signal (V5) input to outputting the comparator output (VCOMP).

The second rising clock edge clocks the high on bit D7 through to bit D6, and clocks the comparator 515 output into flip-flop U2. This makes the select line Se16, the output of AND gate U13, go high. The select line Se16 signal is inverted by inverter U6, which sets the first SSB 525A's NAND latch output QB to a logic low. This action inhibits clocking flip-flop U2, so now the flip-flop U2 continues to hold the result of comparing half of the maximum possible test voltage (VDAC) with the input voltage (VIN). What happens on the select line Se17 from, this point on is irrelevant, since the clock input (CLOCK) to the flip-flop U2 is inhibited. The select line Se16 going high also makes the multiplexer in front of flip-flop U7 switch from outputting the output of the first SSB 525A to outputting the comparator output (VCOMP).

At this point, after the second rising clock edge, the output of the second SSB 525B's flip-flop U7, is logic high (and all the following flip-flops in SSB 525C-I still output a logic low), so the DAC 505 outputs either quarter or three quarters of the maximum test voltage (VDAC), depending on the result of the comparison. The comparator 515 has until the third rising clock edge to resolve whether the test voltage (VDAC) is above or below the input voltage VIN.

On the third rising clock edge, the above sequence repeats while being shifted down the line of Shift-SAR blocks. The logic high in the flip-flop U7 is clocked into the flip-flop U12. This has an effect on the DAC 505 of further bisecting the range of the test voltage (VDAC) for the input voltage VIN, and also makes the flip-flop U17 have a high input and low output. This condition makes the output of AND gate U18 and Se15 go high. When the select line Se15 goes high and is inverted by inverter U11, the output of the second SSB 525B's NAND latch output QB goes low, further inhibiting clocking of the flip-flop U7. The select line Se15 going high also changes the third SSB 525C's multiplexer from outputting the output of the second SSB 525B to outputting the comparator's output (VCMP).

This basic sequence continues until the high input and low output condition is shifted to the ninth SSB 525I, whose flip-flop's Q output is coupled to both of the ninth SSB 525I's SEL and HLD inputs. This causes the eighth SSB 525H's NAND latch to be set, making the NAND latch's output QB of the ninth SSB 525I to go low, and inhibiting any further clock pulses from reaching the flip-flop of the ninth SSB 525I.

To summarize, the high input and low output condition moves down the chain of the SSB 525A-I on each rising edge of the clock. A flip-flop that previously had this condition produces a high output on the rising clock edge. This is the trial high for the binary search algorithm for the associated bit input to the DAC 505. After the comparator 515 has had a full clock period to compare the test voltage (VDAC) with the input voltage (VIN), the next rising clock edge clocks the comparator output (VCMP) into the flip-flop. The action of the high input and low output condition moving downstream by one more SSB block inhibits clocking the flip-flop. Thus, the flip-flops in the SSBs having more significant bits than that of the SSB having the high input and low output conditions hold their results (i.e., the ADC output bit(s)) of the successive approximation.

For the specific simulation depicted in FIGS. 5A-F and 6, the example input voltage (VIN) was chosen to result in an alternating pattern of high and low output bits to better explain circuit function. The example input voltage (VIN) doesn't change how the first pulse of the select line Se17, Se16, and Se15 waveforms appear, nor does it affect the appearance of the inhibit line Inh7, Inh6, and Inh5 waveforms.

Figure 7:
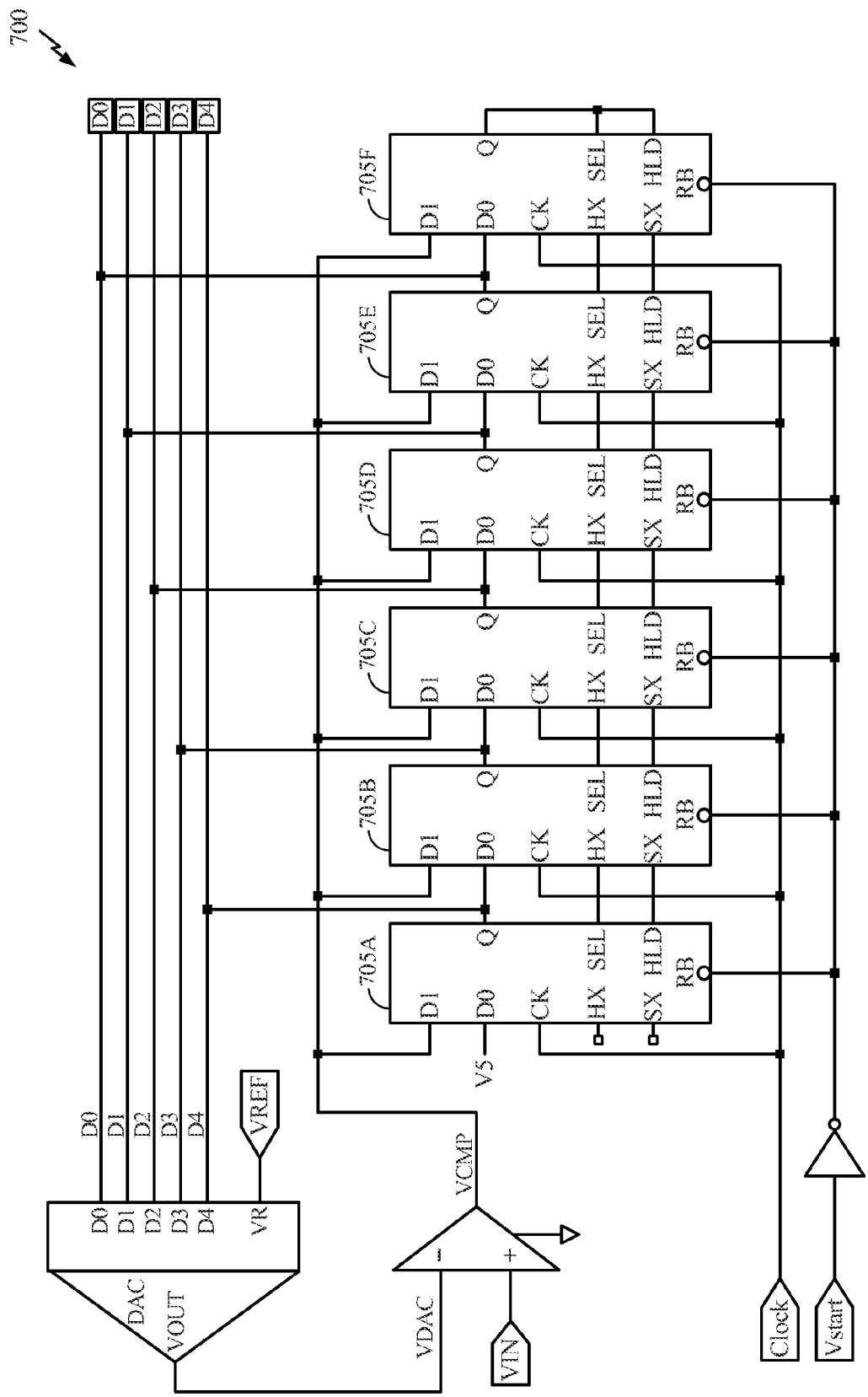
FIG. 7 depicts an exemplary SSB-based 5-bit SAR ADC.
Figure 8A:
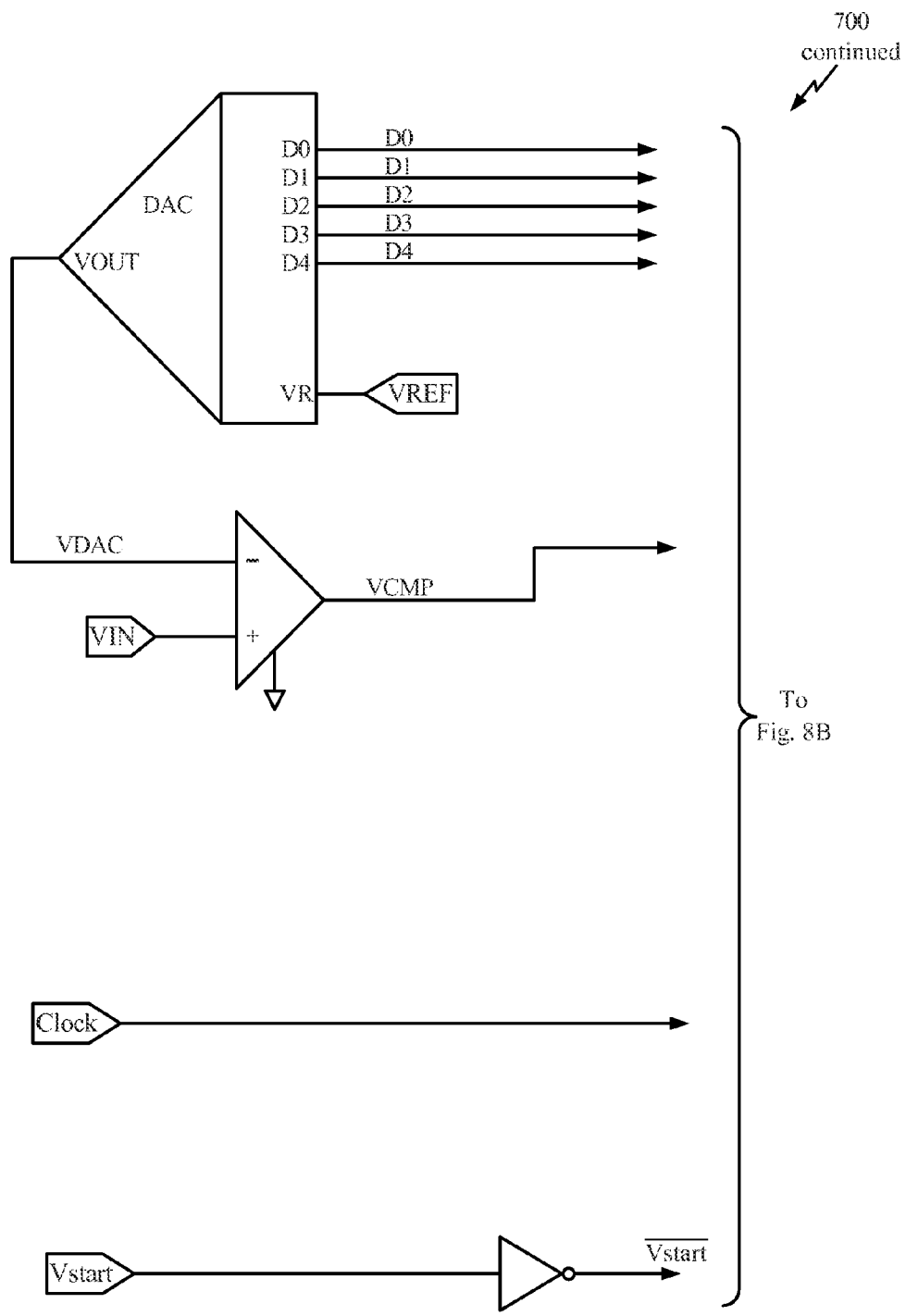
FIGS. 8A-D depict the ADC of FIG. 7 in greater detail.
Figure 8B:
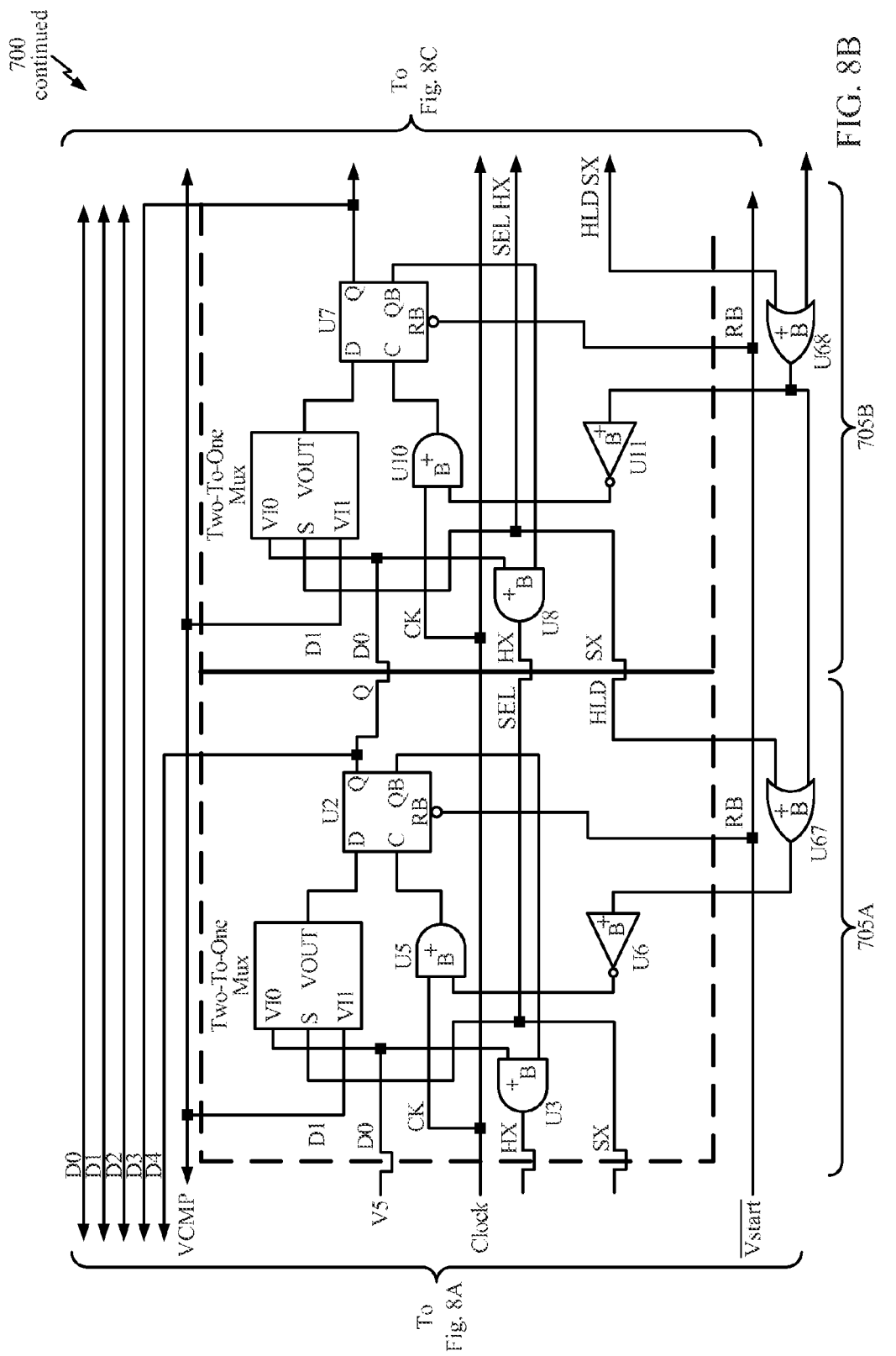
Figure 8C:
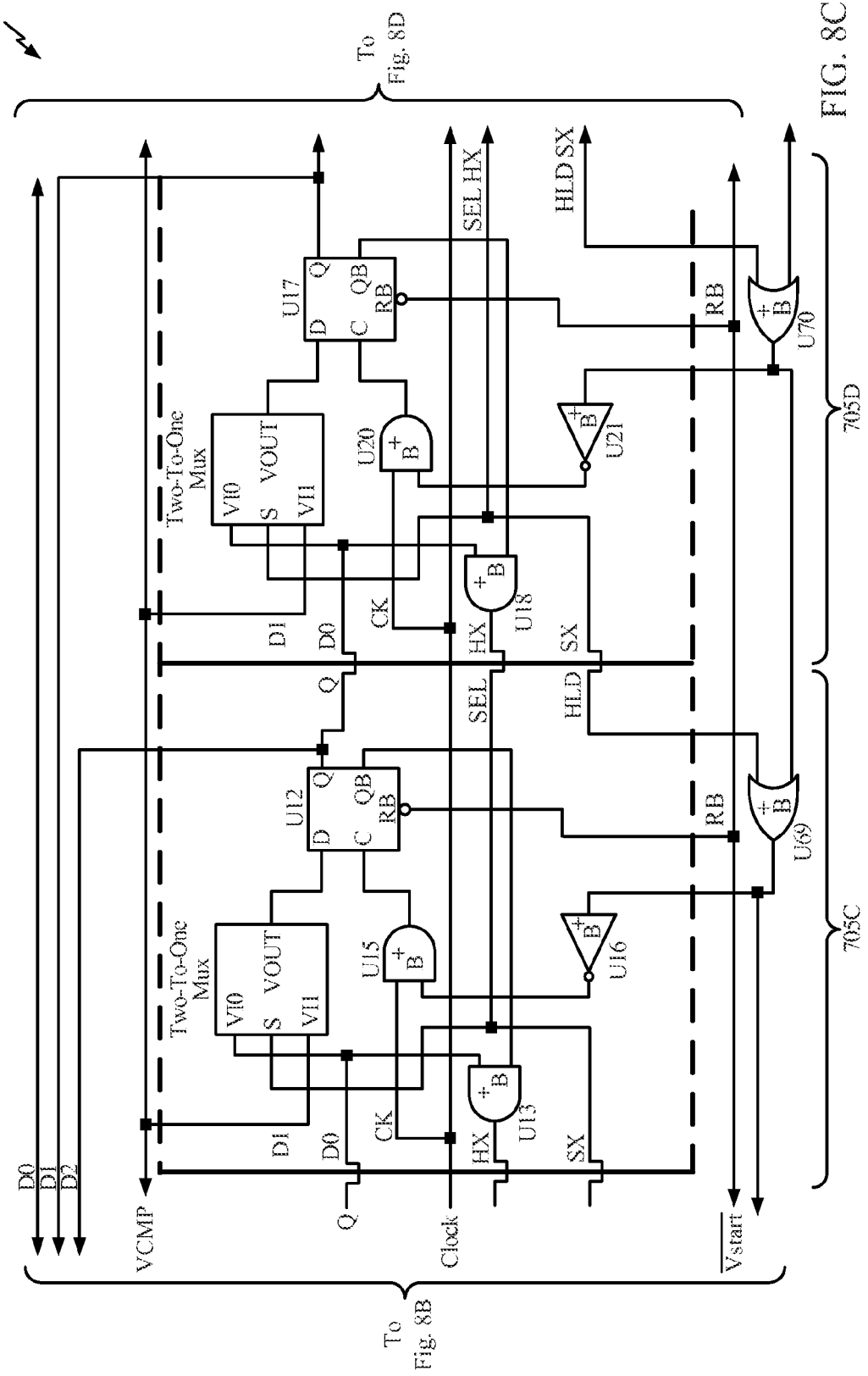
Figure 8D:
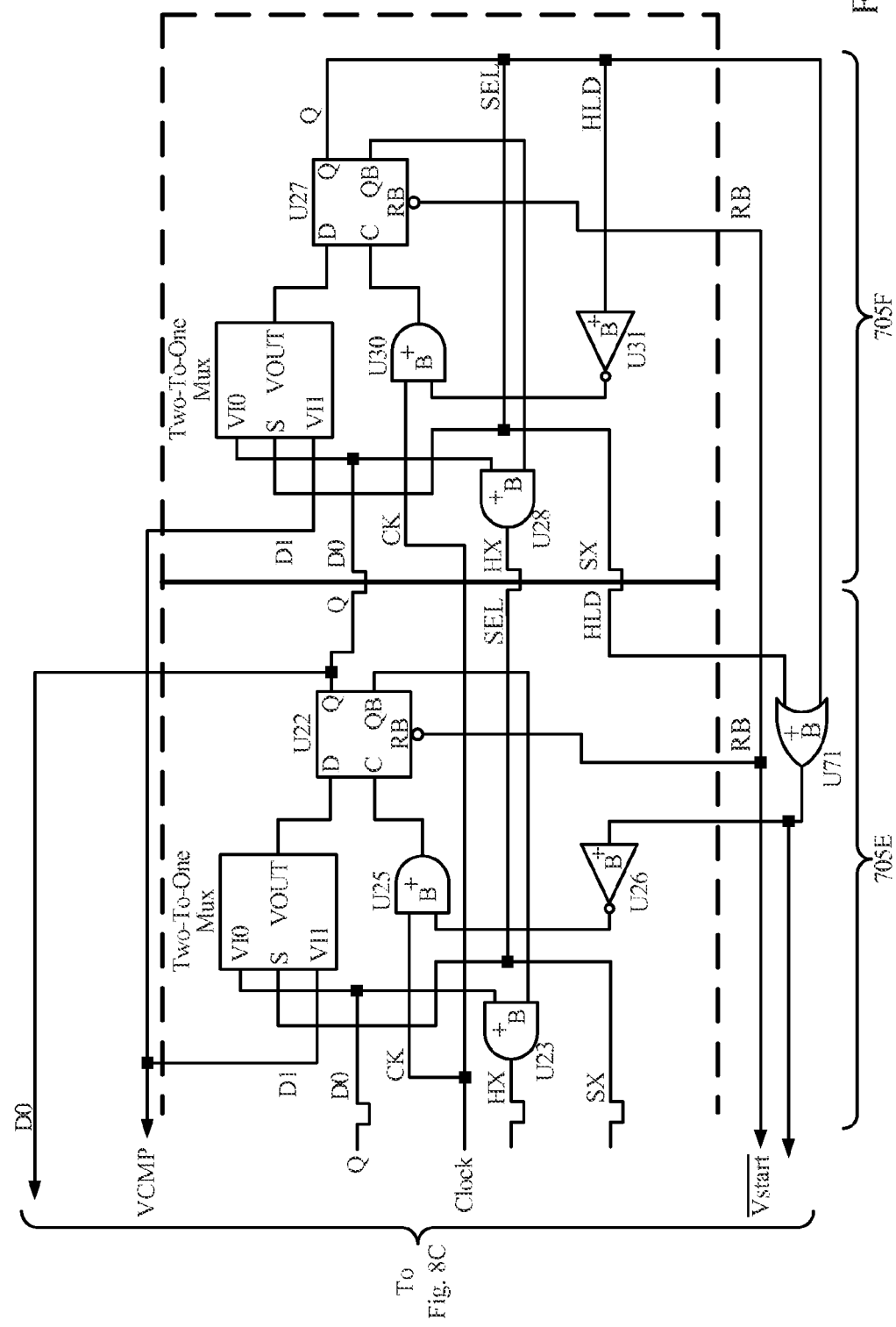

FIGS. 7 and 8A-D depict an exemplary shift-SAR based 5-bit SAR ADC 700. FIGS. 8A-D depict the SAR ADC 700 in greater detail. FIGS. 7 and 8A-D show the ease of scaling ADC circuits implementing a SSB, such as the SSB 300A, as FIG. 7 shows six SSB blocks and has a uniform structure. The first through sixth SSBs 705A-705F implemented in the SAR ADC 700 are functionally similar to the SSB 300A, and in examples the SSB 300A is used as the SSB 705A-705F.

The sixth SSB 705F, which is shown on the rightmost portion of FIGS. 7 and 8A-D is required to sense an end of the conversion cycle. A complete SSB circuit is not required for this function, but using a complete SSB circuit reduces a number of distinct circuit blocks that are required.

Figure 9:
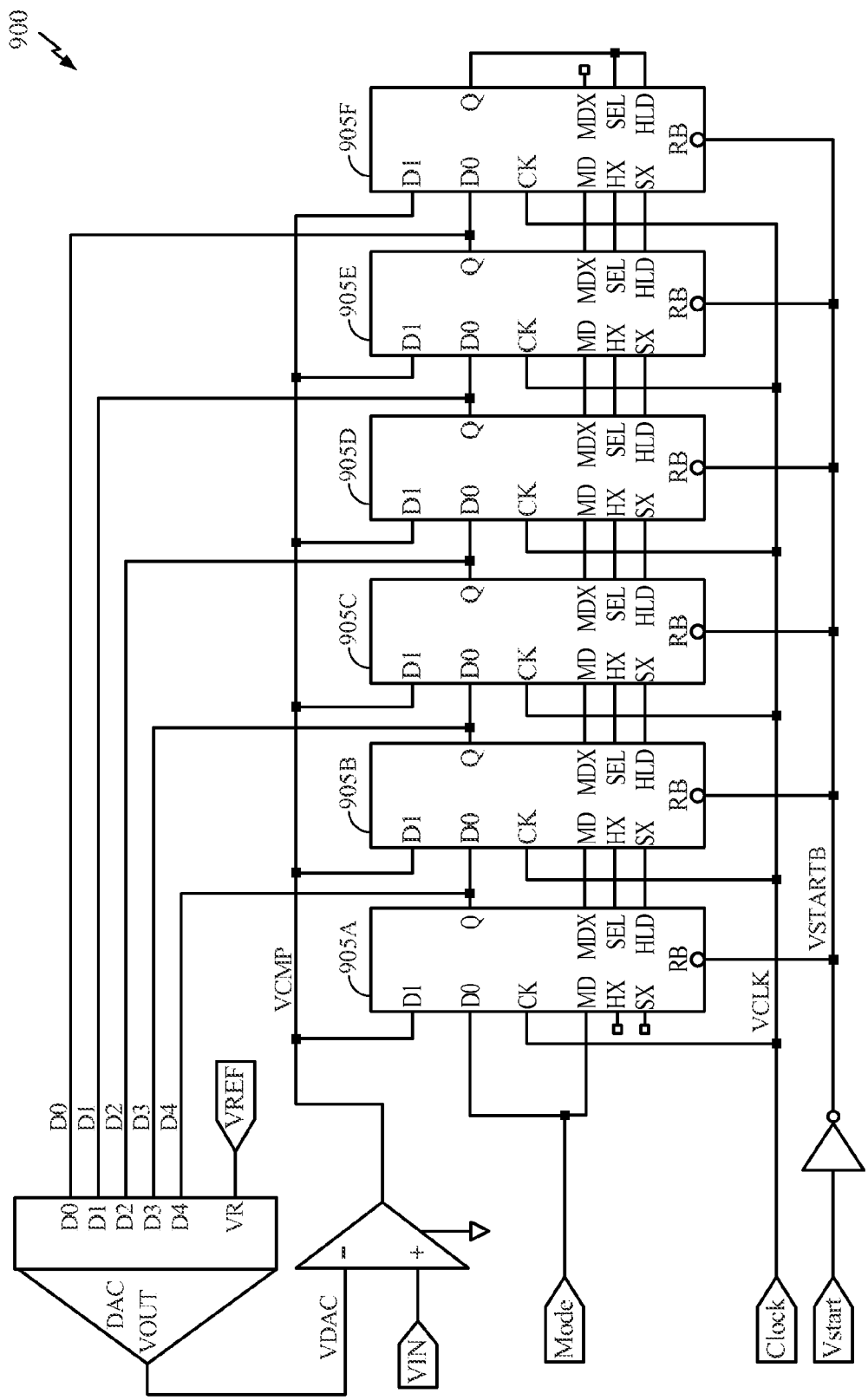
FIG. 9 depicts another exemplary SSB-based 5-bit SAR ADC with a serial readout feature.

FIG. 9 depicts another exemplary SSB-based 5-bit SAR ADC 900 having a serial readout port. FIG. 9 also shows the ease of scaling ADC circuits implementing a SSB, such as the SSB 400, as FIG. 9 shows six SSB blocks and has a uniform structure. The first through sixth SSBs 905A-905F implemented in the SAR ADC 900 are functionally similar to the SSB 400 and in examples the SSB 400 is used as the SSB 905F-905F. In the SAR ADC 900, a final digital output can be read out serially instead of in parallel.

The sixth SSB 905F, which is shown on the rightmost portion of FIG. 9, is required to sense an end of the conversion cycle. A complete SSB circuit is not required for this function, but using a complete SSB circuit reduces a number of distinct circuit blocks that are required.

Figure 10:
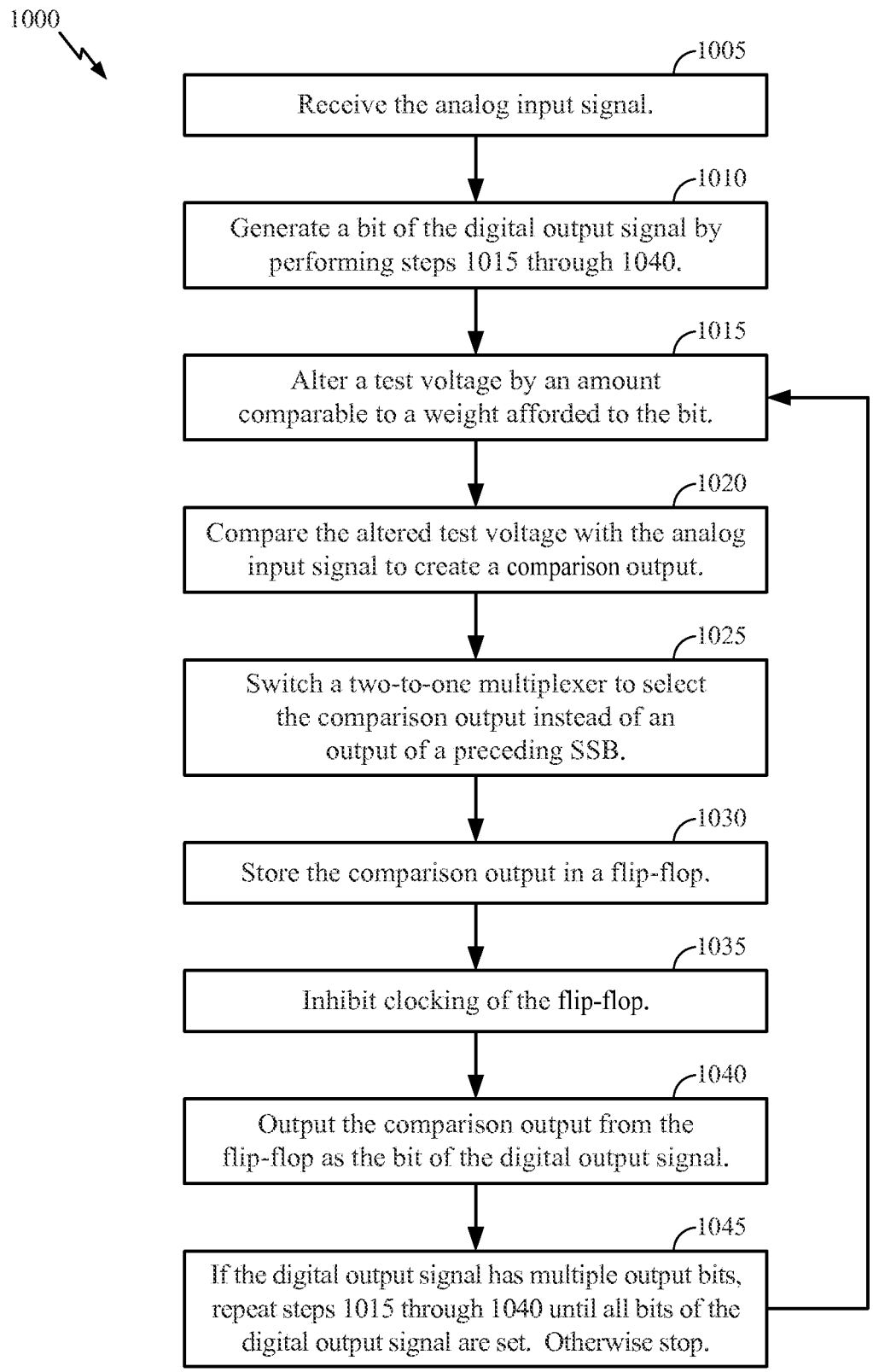
FIG. 10 depicts an exemplary method for digitally representing an analog input signal.

FIG. 10 depicts an exemplary method 1000 for digitally representing an analog input signal. The method for digitally representing an analog input signal can be performed by the apparatus described hereby, such as the SAR ADC 500.

In step 1005, the analog input signal is received.

In step 1010, a bit of the digital output signal is generated by performing steps 1015 through 1040.

In step 1015, a test foliage is altered by an amount comparable to a weight afforded to the bit.

In step 1020, the altered test voltage is compared with the analog input signal to create a comparison output.

In step 1025, a two-to-one multiplexer is switched to select the comparison output instead of an output of a preceding SSB. If there is no preceding SSB, as in the case of an SSB for a most significant bit, then the two-to-one multiplexer is switched to select the comparison output instead of selecting an initial input bit.

In step 1030, the comparison output is stored in a flip-flop.

In step 1035, clocking of the flip-flop is inhibited.

In step 1040, the comparison output is output from the flip-flop as the bit of the digital output signal.

In step 1045, if the digital output signal has multiple output bits, repeat steps 1015 through 1040 until all bits of the digital output signal are set. Otherwise, the method 1000 can optionally stop or can optionally repeat, starting at step 1005. When steps 1015 through 1040 are repeated to produce multiple bits of the digital output signal. each iteration of steps 1010 through 1040 is performed with a different (e.g., decreasing) weight afforded to the respective bit being determined.

Those of skill in the art will appreciate that information and signals may be represented g any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM.®. etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Rel15 Re16, Re17) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

At least a portion of the methods, sequences and/or algorithms described in connection with the embodiments disclosed herein may be embodied directly in hardware, in a software module executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium can be coupled to the processor such that the processor can read information from, and write information to, the storage medium. In an alternative, the storage medium may be integral with the processor.

Further, many embodiments are described in terms of sequences of actions to be performed by, for example, elements of a computing device. Various actions described herein can be performed by a specific circuit (e.g., an application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured to" perform a described action.

An embodiment of the invention can include a computer readable media embodying a method described herein. Accordingly, the invention is not limited to illustrated examples and any means for performing the functionality described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a machine-readable media and/or a computer-readable media. embodying instructions which, when executed by a processor, transform a processor and any other cooperating devices into a machine for performing a function described hereby/at least a part of the apparatus described hereby.

Nothing stated or illustrated herein is intended to cause a dedication of any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A successive approximation register (SAR), comprising:
   a two-to-one multiplexer that is controllable to output either an input from a preceding shift-successive approximation register block or an input from a comparison of a test voltage and an analog input signal;
   a flip-flop having a data input coupled to the output of the two-to-one multiplexer and configured to perform functions of a shift register and a flip-flop; and
   a NAND latch configured to inhibit clocking of the flip-flop.

2. The SAR of claim 1, wherein at least a part of the SAR is integrated on a semiconductor die.

3. The SAR of claim 1, further comprising at least one of a processor, integrated circuit, base station, or a mobile device, with which the flip-flop is integrated.

4. The SAR of claim 1, further comprising an AND gate coupled between the NAND latch and the flip-flop, wherein an output of the NAND latch and a clock line are input to the AND gate, and the output of the AND gate is coupled to a clock input of the flip-flop.

5. The SAR of claim 1, further comprising an RC delay circuit and a two-input OR gate configured to inhibit clocking of the flip-flop.

6. The SAR of claim 1, further comprising a serial readout circuit configured to read a state of the flip-flop.

7. The SAR of claim 1, further comprising a parallel readout circuit configured to read a state of the flip-flop.

8. An analog to digital converter (ADC), comprising:
   a successive approximation register (SAR) including:
   a two-to-one multiplexer that is controllable to output either an input from a preceding shift-successive approximation register block or an input from a comparison of a test voltage and an analog input signal;
   a flip-flop having a data input coupled to the output of the two-to-one multiplexer and configured to perform functions of a shift register and a flip-flop; and
   a NAND latch configured to inhibit clocking of the flip-flop.

9. The ADC of claim 8, wherein at least a part of the ADC is integrated on a semiconductor die.

10. The ADC of claim 8, further comprising at least one of a processor, integrated circuit, base station, or a mobile device, with which the flip-flop is integrated.

11. The ADC of claim 8, further comprising an AND gate coupled between the NAND latch and the flip-flop, wherein an output of the NAND latch and a clock line are input to the AND gate, and the output of the AND gate is coupled to a clock input of the flip-flop.

12. The ADC of claim 8, further comprising an RC delay circuit and a two-input OR gate configured to inhibit clocking of the flip-flop.

13. The ADC of claim 8, further comprising a serial readout circuit configured to read a state of the flip-flop.

14. The ADC of claim 8, further comprising a parallel readout circuit configured to read a state of the flip-flop.

15. The ADC of claim 8, wherein the ADC does not include a shift register.

16. A method for digitally representing an analog input signal, comprising:
   receiving the analog input signal; and
   generating a bit of the digital output signal by:
      altering a test voltage by an amount comparable to a weight afforded to the bit;
      comparing the altered test voltage with the analog input signal to create a comparison output;
      switching a two-to-one multiplexer to select the comparison output instead of an output of a preceding shift-successive approximation register block output;
      storing the comparison output in a flip-flop;
      inhibiting clocking of the flip-flop with a NAND gate; and
      outputting the comparison output from the flip-flop as the bit of the digital output signal.

17. An apparatus configured to digitally represent an analog input signal, comprising:
   means for receiving the analog input signal; and
   means for generating a bit of the digital output signal by:
      altering a test voltage by an amount comparable to a weight afforded to the bit;
      comparing the altered test voltage with the analog input signal to create a comparison output;
      switching a two-to-one multiplexer to select the comparison output instead of a preceding shift-successive approximation register block output;
      storing the comparison output in a flip-flop;
      inhibiting clocking of the flip-flop with a NAND gate; and
      outputting the comparison output from the flip-flop as the bit of the digital output signal.

18. The apparatus of claim 17, wherein at least a part of the means for generating the bit of the digital output signal is integrated on a semiconductor die.

19. The apparatus of claim 17, further comprising at least one of a processor, integrated circuit, base station, or a mobile device, with which the means for generating the bit of the digital output signal is integrated.

20. A non-transitory computer-readable medium, comprising:
   instructions stored thereon that, if executed by a lithographic device, cause the lithographic device to fabricate an integrated circuit, including:
      a successive approximation register (SAR) including:
      a two-to-one multiplexer that is controllable to output either an input from a preceding shift-successive approximation register block or an input from a comparison of a test voltage and an analog input signal;
      a flip-flop having a data input coupled to the output of the two-to-one multiplexer and configured to perform functions of a shift register and a flip-flop; and
   a NAND latch configured to inhibit clocking of the flip-flop.

21. A non-transitory computer-readable medium, comprising:
   instructions stored thereon that, if executed by a lithographic device, cause the lithographic device to fabricate an integrated circuit, including:
      an analog to digital converter (ADC), having a successive approximation register (SAR) including:
      a two-to-one multiplexer that is controllable to output either an input from a preceding shift-successive approximation register block or an input from a comparison of a test voltage and an analog input signal;

a flip-flop having a data input coupled to the output of the two-to-one multiplexer and configured to perform functions of a shift register and a flip-flop; and a NAND latch configured to inhibit clocking of the flip-flop.

22. A successive approximation register (SAR), comprising:

a two-to-one multiplexer that is controllable to output either an input from a preceding shift-successive approximation register block or an input from a comparison of a test voltage and an analog input signal;

a flip-flop having a data input coupled to the output of the two-to-one multiplexer and configured to perform functions of a shift register and a flip-flop; and a NOR latch configured to inhibit clocking of the flip-flop.

23. The SAR of claim 22, wherein at least a part of the SAR is integrated on a semiconductor die.

24. The SAR of claim 22, further comprising at least one of a processor, integrated circuit, base station, or a mobile device, with which the flip-flop is integrated.

25. The SAR of claim 22, further comprising a NOR gate coupled between the NOR latch and the flip-flop, wherein an output of the NOR latch and a clock line are input to the NOR gate, and the output of the NOR gate is coupled to a clock input of the flip-flop.

26. The SAR of claim 22, further comprising a serial readout circuit configured to read a state of the flip-flop.

27. The SAR of claim 22, further comprising a parallel readout circuit configured to read a state of the flip-flop.

28. An analog to digital converter (ADC), comprising:

a successive approximation register (SAR) including:

a two-to-one multiplexer that is controllable to output either an input from a preceding shift-successive approximation register block or an input from a comparison of a test voltage and an analog input signal;

a flip-flop having a data input coupled to the output of the two-to-one multiplexer and configured to perform functions of a shift register and a flip-flop; and a NOR latch configured to inhibit clocking of the flip-flop.

29. The ADC of claim 28, wherein at least a part of the ADC is integrated on a semiconductor die.

30. The ADC of claim 28, further comprising at least one of a processor, integrated circuit, base station, or a mobile device, with which the flip-flop is integrated.

31. The ADC of claim 28, further comprising an NOR gate coupled between the NOR latch and the flip-flop, wherein an output of the NOR latch and a clock line are input to the NOR gate, and the output of the NOR gate is coupled to a clock input of the flip-flop.

32. The ADC of claim 28, further comprising a serial readout circuit configured to read a state of the flip-flop.

33. The ADC of claim 28, further comprising a parallel readout circuit configured to read a state of the flip-flop.

34. The ADC of claim 28, wherein the ADC does not include a shift register.

* * * * *